United States Patent [19]

Chambers, IV

[11] Patent Number: 5,481,701
[45] Date of Patent: Jan. 2, 1996

[54] METHOD AND APPARATUS FOR PERFORMING DIRECT READ OF COMPRESSED DATA FILE

[75] Inventor: Lloyd L. Chambers, IV, Menlo Park, Calif.

[73] Assignee: Salient Software, Inc., Palo Alto, Calif.

[21] Appl. No.: 840,869

[22] Filed: Feb. 25, 1992

Related U.S. Application Data

[63] Continuation-in-part of Ser. No. 759,226, Sep. 13, 1991, Pat. No. 5,155,484.

[51] Int. Cl.$^6$ .............................. G06F 17/30; G06F 5/00
[52] U.S. Cl. .................. 395/600; 395/488; 395/492; 395/497.02; 395/182.04; 341/106; 341/67; 341/51; 364/974; 364/966.5; 364/951.3; 364/282.1; 364/254.3; 364/DIG. 2; 364/DIG. 1
[58] Field of Search ................................ 395/425, 250, 395/700, 650; 341/106, 67, 55, 51; 364/DIG. 1, DIG. 2; 360/8, 7.01

[56] References Cited

U.S. PATENT DOCUMENTS

| | | | |
|---|---|---|---|
| 4,357,635 | 11/1982 | Hasegawa | 360/51 |
| 4,408,301 | 10/1983 | Inda | 340/700 |
| 4,467,421 | 8/1984 | White | 395/425 |
| 4,742,450 | 5/1988 | Duvall et al. | 395/700 |
| 4,782,325 | 11/1988 | Jeppsson et al. | 341/55 |
| 4,891,784 | 1/1990 | Kato et al. | 395/250 |
| 4,897,717 | 1/1990 | Hamilton et al. | 358/133 |
| 4,956,808 | 4/1990 | Aakre et al. | 395/250 |
| 5,210,851 | 5/1993 | Kato et al. | 395/425 |
| 5,237,460 | 8/1993 | Miller et al. | 360/8 |
| 5,237,675 | 8/1993 | Hannon, Jr. | 395/425 |
| 5,289,581 | 2/1994 | Berenguel et al. | 395/200 |

OTHER PUBLICATIONS

Atkinson & Atkinson, *Using C*, Que Corporation, 1990, pp. 9–15, 68–70.

*Primary Examiner*—Thomas G. Black
*Assistant Examiner*—Paul R. Lintz
*Attorney, Agent, or Firm*—Fliesler, Dubb, Meyer & Lovejoy

[57] ABSTRACT

In a block compressed data file, desired given non-compressed data is identified in a subset of a compressed data file and only the subset of the compressed data file containing the desired data is decompressed. Three operating modes according to application access level permission are allowed. The direct-read mode is used for application read-only permission. The file shadowing mode is used for application read/write permission when it is likely that the application will only read from the file without writing to it. The file putback mode is used for application read/write permission when it is likely the application will write to the file. Data caching of decompressed data blocks from a file avoids repetitious decompressing of a data block requested at different times. Block access of the compressed data file occurs through a table of offsets, either stored in the compressed data file itself or constructed from scratch.

33 Claims, 12 Drawing Sheets

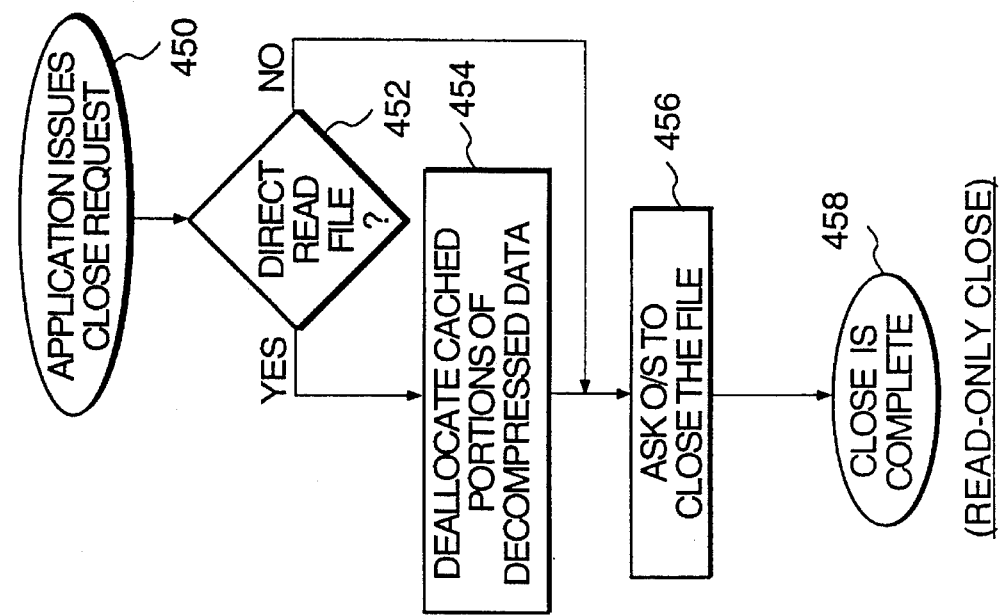
FIG. 4D (READ-ONLY CLOSE)
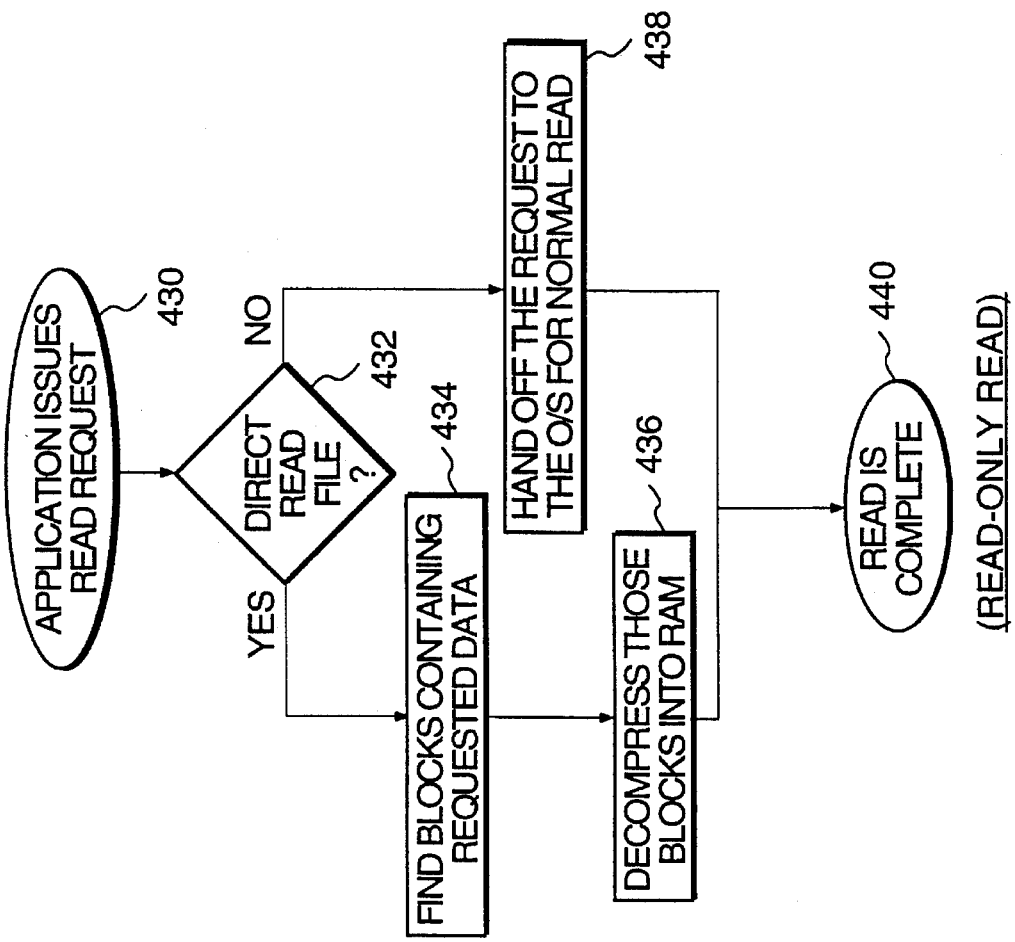
FIG. 4C (READ-ONLY READ)

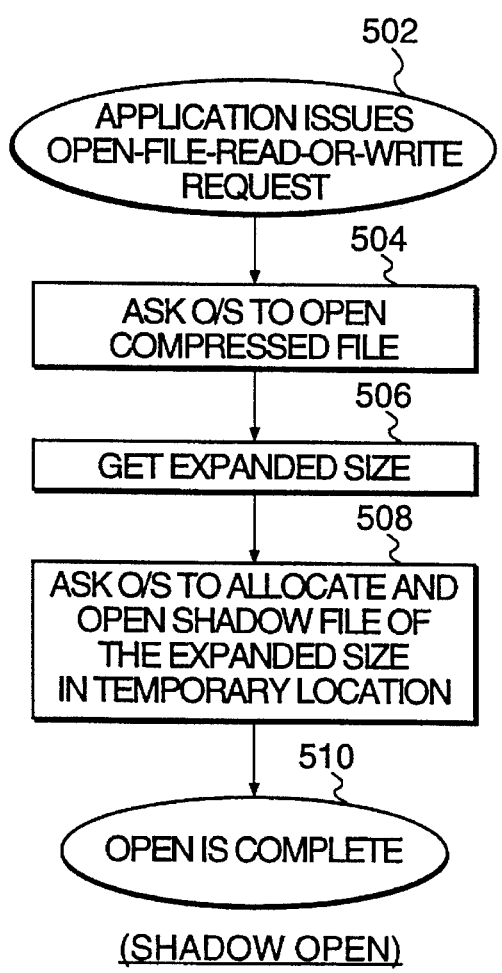
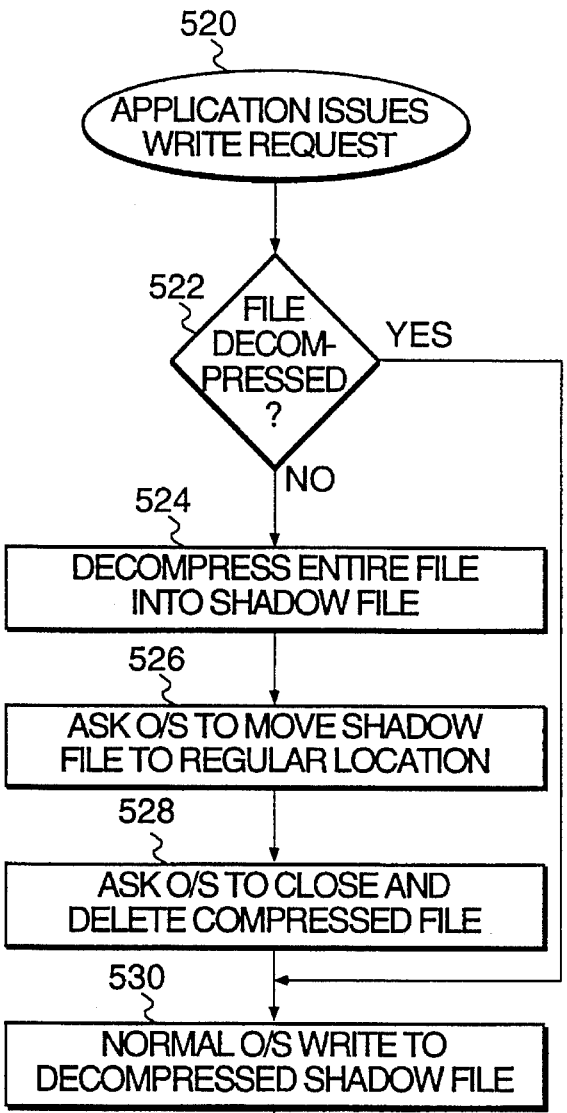
FIG. 5A (SHADOW OPEN)
FIG. 5B (SHADOW WRITE)

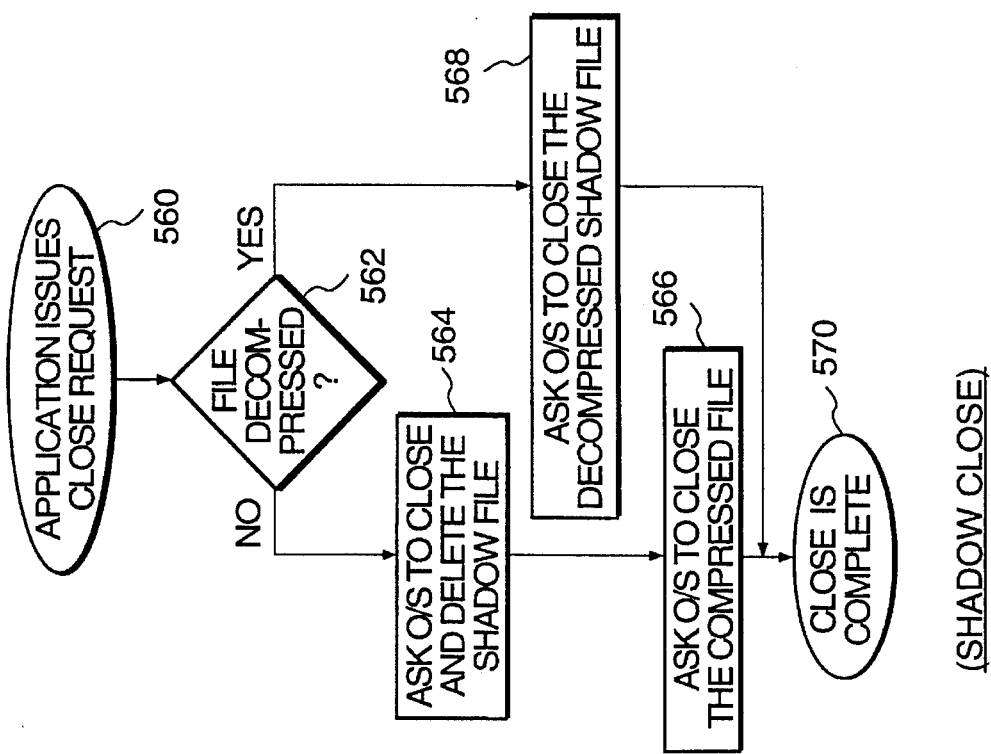
FIG. 5D (SHADOW CLOSE)
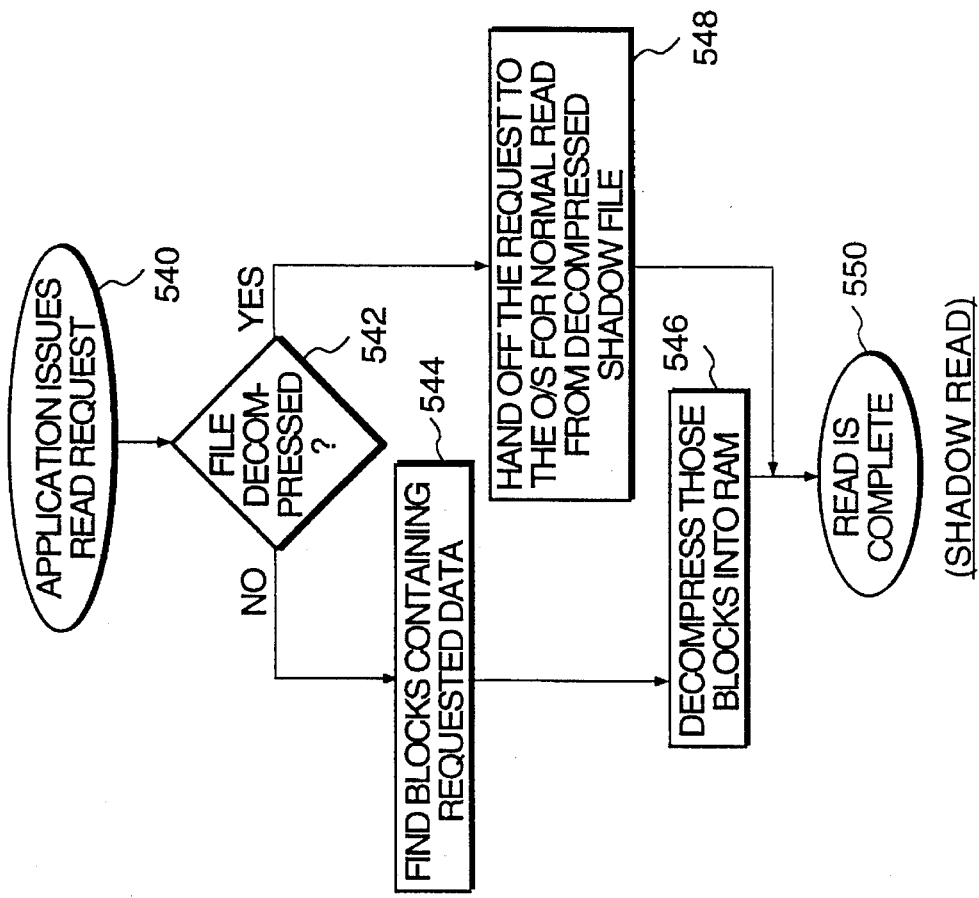
FIG. 5C (SHADOW READ)

(PUTBACK OPEN)

(PUTBACK WRITE)

(PUTBACK READ)

SHADOWING

PUTBACK

METHOD AND APPARATUS FOR PERFORMING DIRECT READ OF COMPRESSED DATA FILE

CROSS-REFERENCE TO RELATED APPLICATIONS

This application is a continuation-in-part of application Ser. No. 07/759,226 entitled "Fast Data Compressor with Direct Lookup Table Indexing into History Buffer", which was filed Sep. 13, 1991 by Lloyd Lamont Chambers IV, which is commonly assigned with the present application, now U.S. Pat. No. 5,155,484, and which is incorporated herein by reference as if fully set forth herein. Another application of particular interest is application Ser. No. 07/839,958 entitled "Method and Apparatus for Locating Longest Prior Target String Matching Current String in Buffer", which was filed Feb. 21, 1992 by Lloyd Lamont Chambers IV, now U.S. Pat. No. 5,426,779. These are commonly assigned to Salient Software, Inc.

LIMITED COPYRIGHT WAIVER

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

BACKGROUND OF THE INVENTION

1. Field of the Invention

The present invention relates generally to reading of data from compressed data files, and more specifically to a method and an apparatus for decompressing and reading only a minimum subset of a compressed data file directly into memory.

2. Description of the Background

Compressed data residing in a data file must generally be decompressed in order to be of any real use. However, if access to only a small portion of the data file is needed, it is wasteful of computational resources to decompress the entire file. CPU time is unnecessarily wasted decompressing the file, and storage space is unnecessarily wasted holding the unneeded portions of the decompressed data.

Presently-available data decompressors appear to suffer both these faults. When a program issues an access request to a compressed file, the data decompressor decompresses the entire file and stores the decompressed version for access by the program. While the data decompressor is operating, the program must wait. If the data decompressor cannot allocate storage for the decompressed file, unknown errors may occur or the results may be otherwise unpredictable.

For example, if the compressed data file is on a disk which has less free space than the decompressed version of the file, the data decompressor may be unable to operate.

Additionally, existing data decompressors do not operate at the same level of logical operation at which most computer programs operate. Specifically, while computer programs tend to issue access requests to a certain file (i.e. on a file basis), existing data decompressors tend to operate at the much lower level of an operating system (i.e. on a block basis, disk basis, device driver basis, or the like).

This incompatibility of operational levels imposes certain additional inefficiencies on existing data decompressors. For example, existing data decompressors do not take sufficient advantage of the various read/write permission levels involved in data access requests. If a program opens a file "read only", for example, there is no need to save a permanent copy of the decompressed data, because it will ultimately be discarded when the program closes the file.

What is needed, therefore, is an improved method and apparatus for accessing data files on a file basis, and within the file basis, on the more limited basis of only a requested subset of the data content of a specified file. The improved method and apparatus should have a reduced usage of computational resources, by decompressing only a minimum amount of data. The improved method and apparatus should operate regardless of how much free storage is present on the medium on which the compressed file is stored. The method and apparatus should, additionally, take optimum advantage of access permission levels indicated by programs issuing data access requests.

SUMMARY OF THE INVENTION

The present invention provides an apparatus and method for providing compressed data from a compressed data file in response to a data request which identifies given non-compressed data in a non-compressed data file. The method and apparatus identify, within in the compressed data file, given compressed data which correspond to the given non-compressed data identified by the data request, decompress the given compressed data to reconstitute the given non-compressed data, and provide the reconstituted non-compressed data in response to the data request.

The invention provides three operating modes, selected according to access level permission requested by an application seeking access to the file. A direct read mode is used for read-only permission; a file shadowing mode is used for read/write permission when it is likely that the application will only read from the file and never write to it; a file putback mode is used for read/write permission when it is likely that the application will write to the file.

The invention provides data caching for decompressed data blocks from a file, to avoid repetitious reading and decompressing of a data block containing two or more data requested at different times, to improve throughput and transparency of the system.

BRIEF DESCRIPTION OF THE DRAWINGS

FIGS. 4A, 5A, and 6A are flowcharts demonstrating operation of the invention in response to file open requests in direct read, file shadowing, and file putback modes, respectively.

FIGS. 4B, 5B, and 6B are flowcharts demonstrating operation of the invention in response to data write requests, in the three modes.

FIGS. 4C, 5C, and 6C are flowcharts demonstrating operation of the invention in response to data read requests, in the three modes.

FIGS. 4D, 5D, and 6D are flowcharts demonstrating operation of the invention in response to file close requests, in the three modes.

DETAILED DESCRIPTION OF THE PREFERRED EMBODIMENTS

I. Components of the Invention

Figure 1:
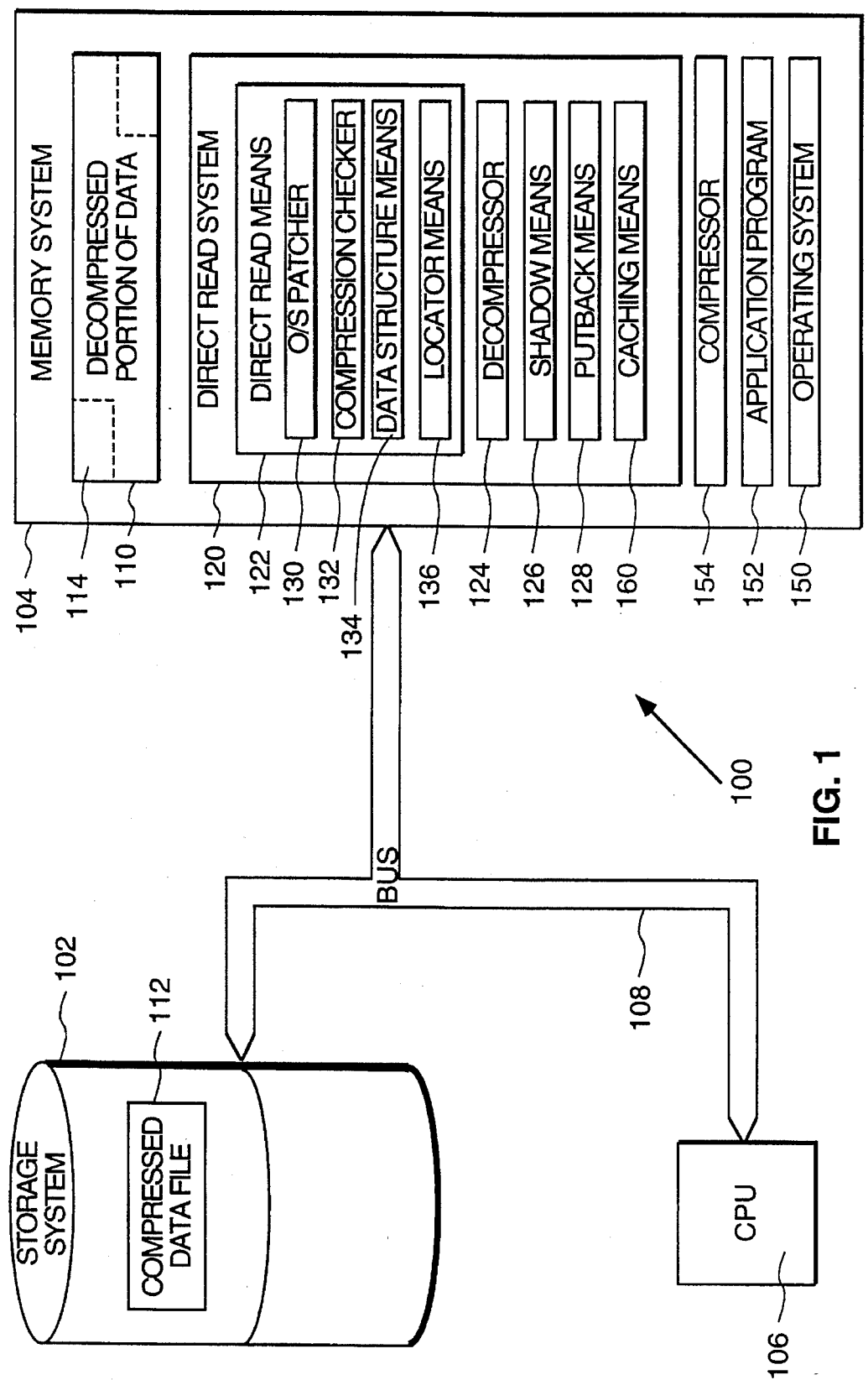
FIG. 1 illustrates the present invention as embodied in a computer system.

FIG. 1 shows the present invention as embodied in a computer system 100 having a storage system 102, a memory system 104, and a central processing unit (CPU) 106 coupled together by a bus 108. The storage system may, for example, be a hard disk drive. The memory system may, for example, be random access memory (RAM). These may also be characterized as permanent and temporary storage, respectively. The present invention may be practiced using a variety of data processing environments. However, the preferred environment is a data processing computer having a CPU, memory, and a permanent storage device.

Figure 10:
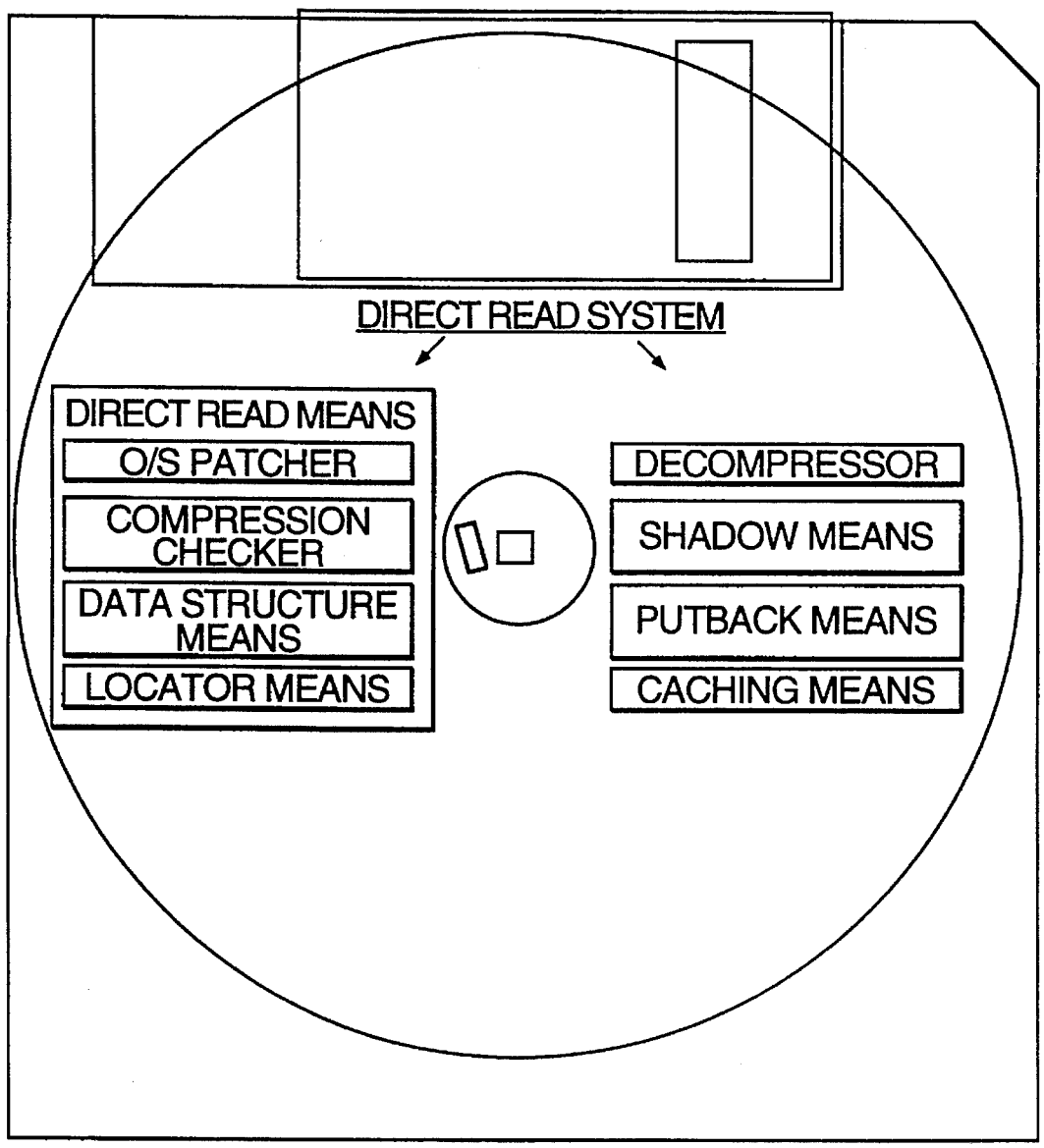
FIG. 10 illustrates the invention as embodied on a recording medium such as a floppy disk.

FIG. 10 illustrates the invention as embodied in a floppy disk or the like, and may be understood to represent any appropriate recording medium upon which the invention may be embodied and from which the invention may be retrieved and/or executed. Other such media include hard disks, removable hard disks, optical discs, PROMs, and the like.

FIG. 1 shows that, at a highest level of abstraction, the present invention may be characterized as an apparatus and method for decompressing only a requested portion 110 of a compressed data file 112 from the storage system to RAM. In practice, the decompressed portion 110 may include certain excess data 114 which are not requested, but which are nevertheless decompressed owing to the particular compression/decompression scheme employed.

The present invention is a direct read system 120 which may reside in RAM while in use. The basic components of the direct read system are a direct read means 122, a decompressor 124, a shadow means 126, a putback means 128, and a caching means 160. The direct read means further includes an operating system patcher 130, a compression checker 132, a data structure means 134, and a locator means 136.

Other components of the computer system may include an operating system 150 which provides a controlling interface to the system hardware. The computer system may further include an application program 152 which issues data file access requests. Such requests may include instructions for such file-oriented operations as "open file", "read data", "write data", "get file position", "set file position", "get end-of-file position", set end-of-file position", "close file", and the like. Data read and write requests may take on a variety of forms. For example, a data read request may specify "read X bytes starting at location Y", or it may specify "read bytes from location X to location Y", or the like. Either of these may be considered as directly or indirectly reciting a starting location, and ending location, and an amount of data.

According to known technology, these requests are ordinarily serviced by the operating system. However, the patcher 130 redirects these requests to be handled by the direct read system. Methods are known by which this is accomplished, such as by altering the contents of a "trap table" or by altering the instructions of the operating system itself. The exact means and methods of the patcher will depend on the particular computer system upon which it is desired to practice the invention.

The computer system may further include a data compressor 154 which compresses data files stored in the storage system. While the data compressor is not a necessary part of the present invention as such, it will be understood that the decompressor 124 is capable of utilizing the same compressed file format as the compressor 154. It will be further understood that the compressor may be included in the invention, to provide data re-compression, for example.

Figure 9:
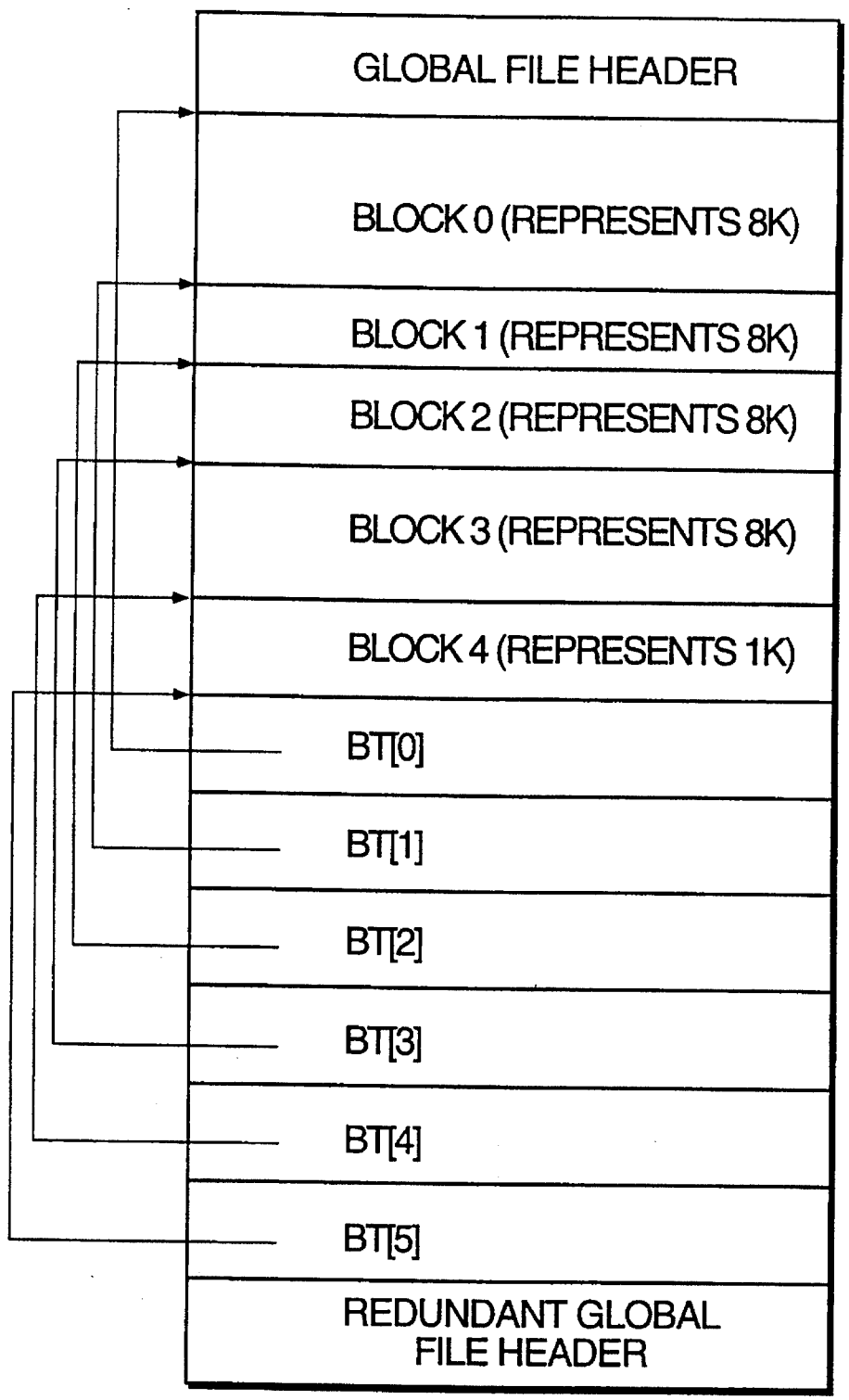
FIG. 9 illustrates one exemplary file format of a file which may be advantageously used with the present invention.

The preferred data compressor and decompressor are described in the cross-referenced applications. The block-oriented compression technique employed therein is ideally suited to use by the present invention, to permit decompression of minimized subsets of a compressed data file, to minimize the waste of computational resources otherwise used at each data request. Because the compression algorithm completely restarts itself for each successive history buffer of data (i.e. the data in one block are compressed entirely independently of data in another block), the present invention is able to extract and decompress only those blocks which contain requested data. FIG. 9 shows the general file format of a compressed data file, which is created by the data compressor and which is readable by the decompressor.

II. General Operation of the Invention

Figure 2:
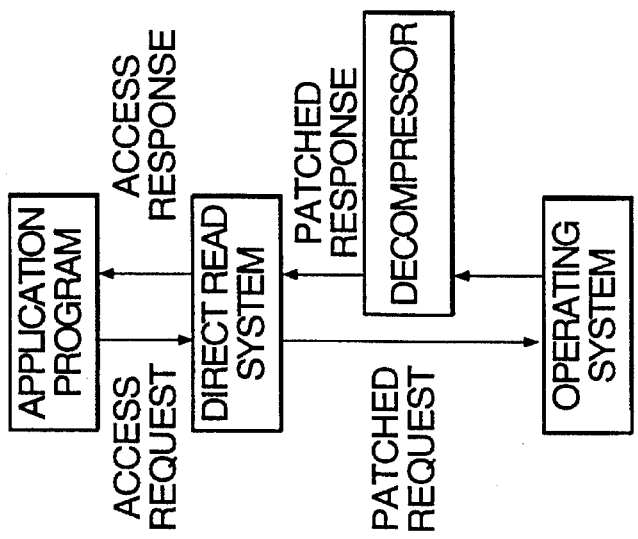
FIG. 2 suggests the overall operation of the invention in the control hierarchy of various levels of a computer system.

FIG. 2 illustrates how the present invention cooperates with an application program and an operating system, to provide a wholly-transparent, seamless interface between the application program and data files, whereby compressed data files can be accessed without modification of—or notice to—either the application program or the operating system.

When the application program issues a data file access request, such as those listed above, the request is intercepted by the direct read system before it arrives at the operating system. This ability is provided by the patcher. For example, the application program may issue the request "read the next byte from file X". The direct read system alters the request according to information retained by the data structure means and locator means. After modification, the request may be "read block Y from file X". The operating system receives this modified request; both the application and the operating system are unaware that the request has been modified. The operating system performs the indicated request, in this case reading block Y from file X.

Then, block Y is decompressed by the decompressor, to form block Y'. The direct read system then extracts the originally-requested byte from the block Y', and returns that byte to the application program. To the application program, the operation of the direct read system is transparent—the application program never knows that its original request was not simply handled by the operating system.

This permits the storage system to store an increased amount of data, without requiring modification of the application program or the operating system. Perhaps more importantly, it requires no intervention or special knowledge by a person using the application program.

The data compressor and decompressor disclosed in the cross-referenced applications have been selected for use in the present invention because their block-oriented nature allows decompression of less than an entire data file, and further because the decompressor is optimized to decompress at highly improved speeds. This dramatically improves the transparency of the present invention to a user. The user may be entirely unaware that decompression is taking place, even when performing operations with which the user has become intimately familiar in a wholly non-compressed environment.

Figure 3:
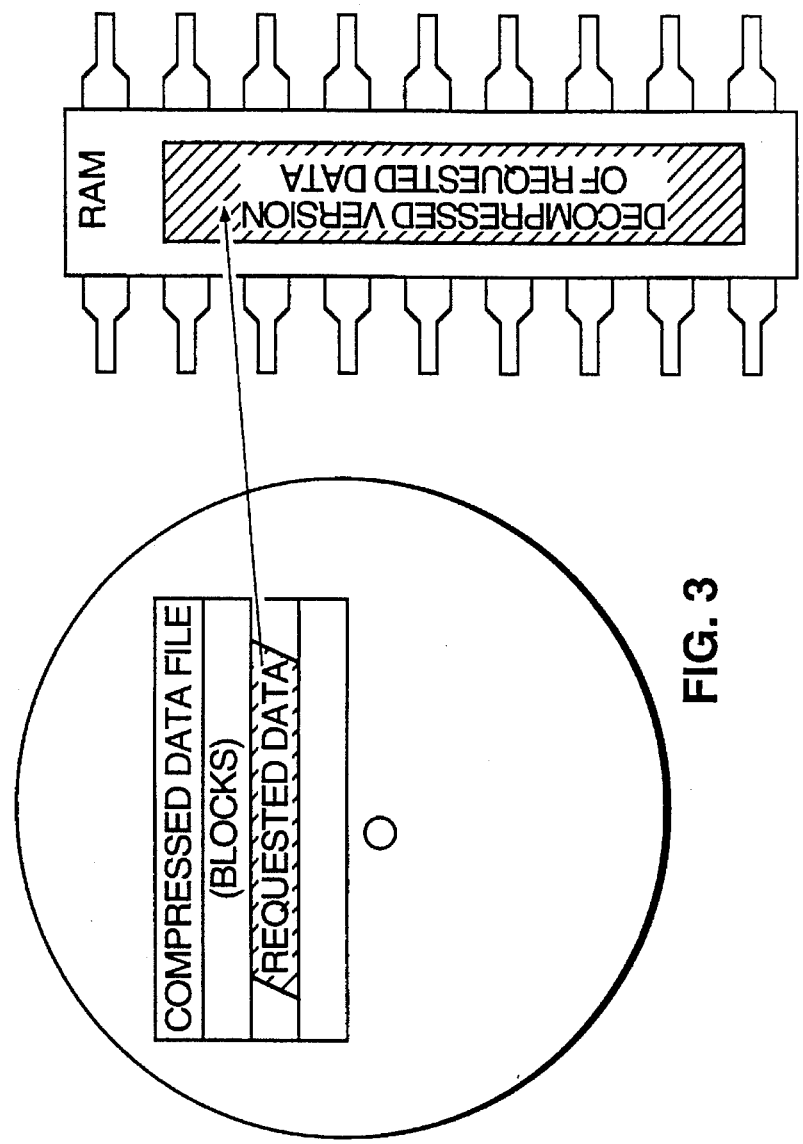
FIG. 3 shows the basic operation of the invention to decompress only requested portions of a data file into memory.

FIG. 3 illustrates that a requested subset of a data file may be read into RAM in response to a data read request, for example. Blocks which do not include the requested data are not decompressed, and are not read into RAM. This reduces CPU time required for decompression, and reduces bus usage required for transfer from the storage system to RAM.

III. Operation of the Invention in Direct Read Mode

FIGS. 4A–D illustrate operation of the present invention in a read-only direct read mode, showing file open, write, read, and close operations, respectively.

A. File Open Request—Direct Read Mode

Figure 4A:
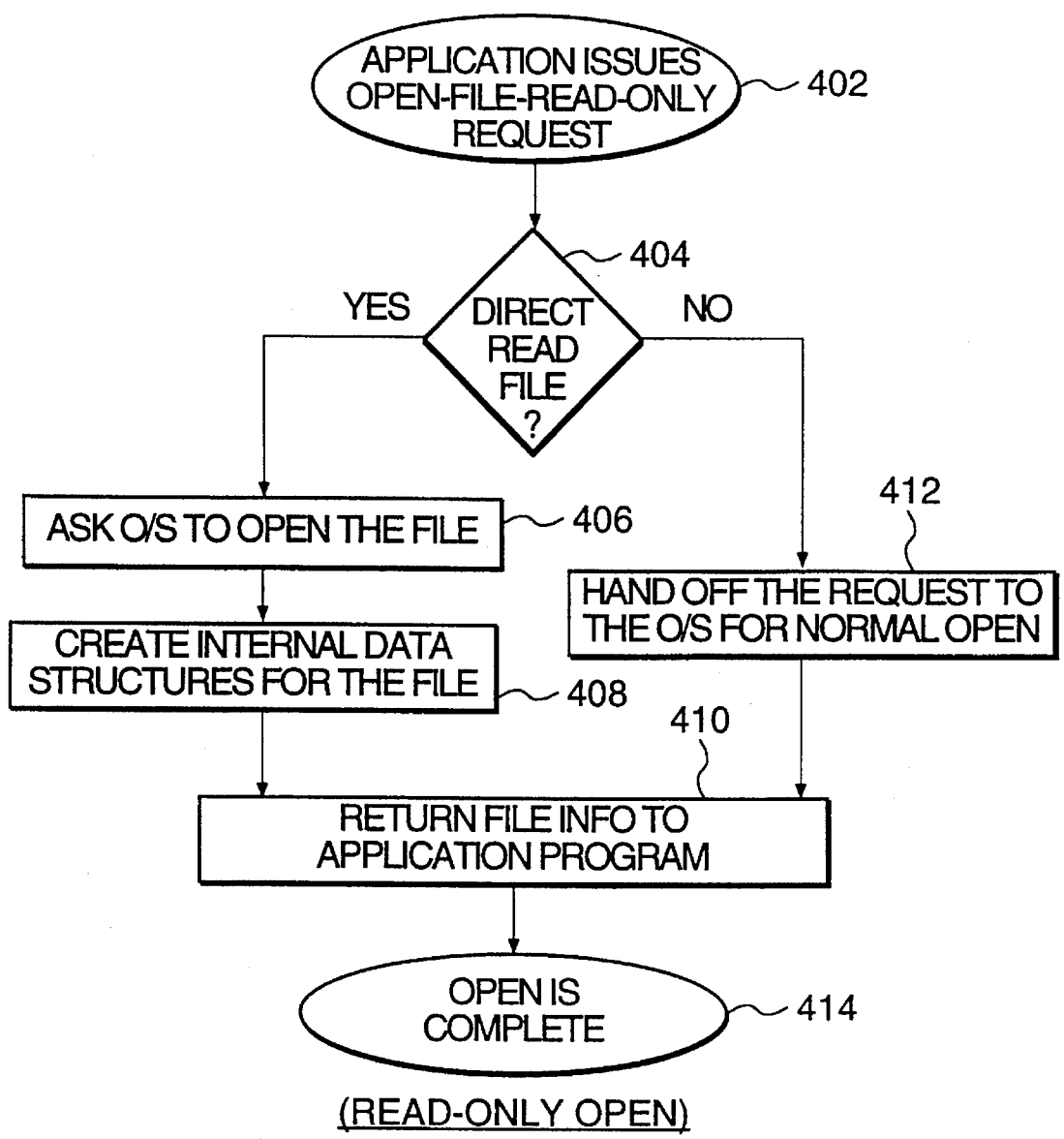

FIG. 4A shows operations beginning at node 402 when an application issues a data access request to open a file for read-only permission. Initially, at conditional block 404, the compression checker 132 in the direct read means 122 determines whether the indicated file is compressed, and if so, whether it is compressed using a format which the decompressor can decompress. According to the decompressor of the cross-referenced applications, this may be performed simply by consulting the global file header of the compressed file.

Throughout the remainder of this application, a file compressed in a format which the decompressor 154 can decompress will be referred to as a "direct read file". If conditional block 404 determines that the file is a direct read file, operation passes to block 406. There, the direct read system issues a request for the operating system to open the file. Upon opening of the file, operation continues at block 408, where the data structure means 134 creates data structures for the open file. These data structures will be described below in Section VII regarding "Access to Individual Blocks".

Then, at block 410, the direct read system returns to the application program that file information which the application program would ordinarily expect to receive directly from the operating system. Such information may include, for example, a file number, file size, current file pointer value, and the like.

If, at conditional block 404, it is determined that the file is not a direct read file, operation passes to block 412, where the direct read system simply hands off the file open request to the operating system. At this point, the direct read system, in essence, "takes itself out of the loop" regarding the particular file. Then, at block 410, the operating system itself returns the proper file information to the application program, entirely bypassing the direct read system.

In either case, the file open operation is complete at node 414.

B. Data Write Request—Direct Read Mode

Figure 4B:
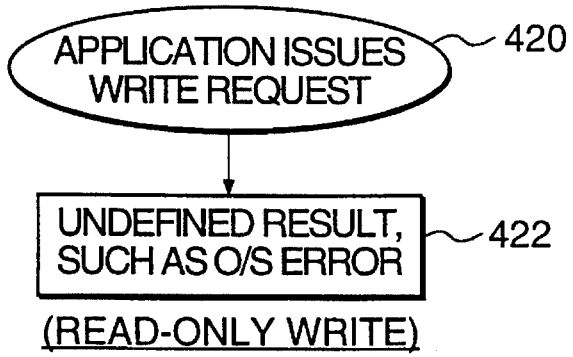

FIG. 4B illustrates operation of the invention in response to a write request in read-only mode. Operation begins at node 420, when the application program issues the request. Then, unknown or undefined operations are performed by the operating system at block 422, because of the illogical request for writing to a read-only file. Typically, the application program will receive an error message result from the operating system, and no data will be written.

C. Data Read Request—Direct Read Mode

FIG. 4C illustrates data read operations beginning at node 430, when the application program issues a data read request. Operation continues at conditional block 432, where the compression checker determines whether the file is a direct read file.

If it is a direct read file, operation continues at block 434, where the locator means 136 identifies which blocks of the compressed data file contain the requested data. Then, at block 436, the decompressor 124 decompresses those blocks into RAM. Then, the specifically-requested bytes of those blocks are copied into the buffer where the application program expects to receive them.

At conditional block 432, if the file is not a direct read file, operation passes to block 438, where the direct read system takes itself out of the loop by handing the request off to the operating system for normal data read operations.

In either case, data read operations are complete at node 440.

D. File Close Request—Direct Read Mode

FIG. 4D illustrates operation of the direct read system in response to a file close request issued by the application program at node 450. Operation continues at conditional block 452, where the compression checker determines whether the file is a direct read file.

If it is a direct read file, operation continues at block 454, where the data structure means 134 discards any data structures used for the file and the caching means 160 de-allocates any cached portions of the decompressed data. Then, at block 456, the direct read system issues a request for the operating system to close the open direct read file.

At conditional block 452, if the file is not a direct read file, operation passes directly to block 456. In either case, file close operations are complete at node 458.

IV. Operation of the Invention in File Shadowing Mode

FIGS. 5A–D illustrate file open, data write, data read, and file close operations of the direct read system when operating in file shadowing mode. In the interest of clarity, FIGS. 5A–D do not show conditional blocks determining whether the request involves a direct read file. It will be understood that, as in FIGS. 4A–D, if other than a direct read file is involved, the direct read system will hand off the request for normal operations by the operating system.

Direct read operations in file shadowing mode are performed by the direct read means, just as in normal read-only direct read mode. Additional features of file shadowing mode are provided by the shadow means, and will be described below, with reference to FIGS. 5A–D and FIGS. 7A–F.

A. File Open Request—File Shadowing Mode

FIG. 5A shows operations of the direct read system in file shadowing mode. File shadowing mode is entered at node 502 when an application requests to open a file for read/write permission in circumstances indicating that the application will most likely only read from, and not write to, the file.

At block 504, the direct read system issues a request for the operating system to open the compressed file. Then, at block 506, the shadow means determines the decompressed (expanded) size of the entire file. As indicated in the cross-referenced applications, this information may be obtained by simply consulting the global file header of the compressed file.

Then, at block 508, the shadow means issues a request for the operating system to open a shadow file of this decompressed size. In one mode, this request may include a first request to open a file, and a second request to set the end-of-file marker to the indicated position. Thus, the shadow file will be sufficiently large, but will contain garbage. At this point, the shadow file serves only as a "placeholder" file, ensuring that sufficient storage is reserved to hold the entire file upon a subsequent decompression. The shadow file may, in one mode, be stored in a separate location from the original, compressed data file.

Figure 7A:
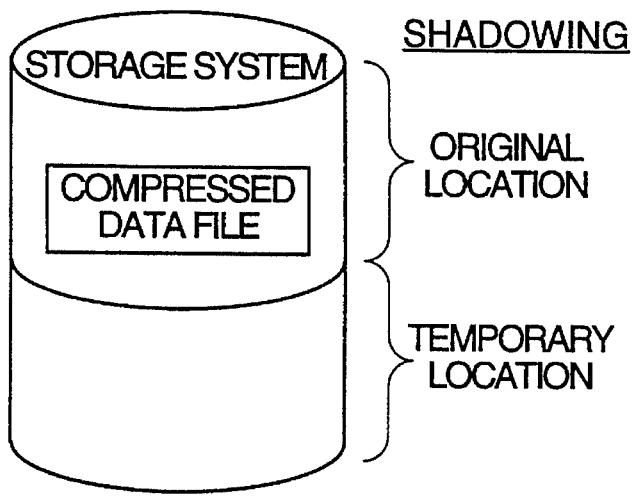
FIGS. 7A–F illustrate operation of the invention to create, decompress, and move files in the file shadowing mode.

FIG. 7A shows the compressed data file as residing in an original location in the storage system, while the storage system further includes a temporary storage location. In one mode, the original and temporary locations may be distinct "directories" or "folders" in the storage system. In other modes, they could be separate hard disks, or the like.

Figure 7D:
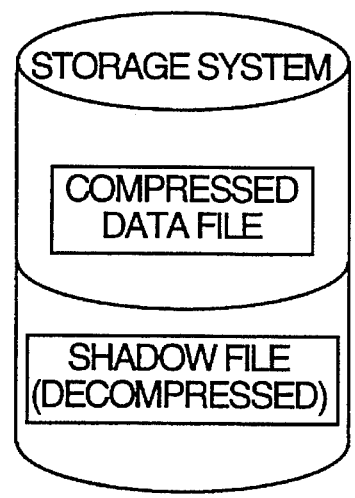
Figure 7B:
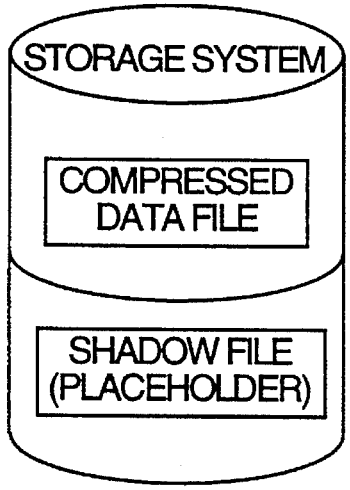

FIG. 7B shows the compressed data file residing in its original location, and the shadow file residing in the temporary location.

File open operations are complete at node 510.

B. Data Write Request—File Shadowing Mode

FIG. 5B illustrates operation of the shadow means in response to a data write request issued by the application program at node 520. Operation continues at conditional block 522, where the shadow means determines whether the shadow file is still only a placeholder, or, in other words, whether the compressed data file has yet been decompressed.

If the file has not been decompressed, operation passes to block 524, where the decompressor decompresses the entire data file into the shadow file. FIG. 7B shows the shadow file as a placeholder, while FIG. 7D shows the shadow file as including decompressed data.

Figure 7E:
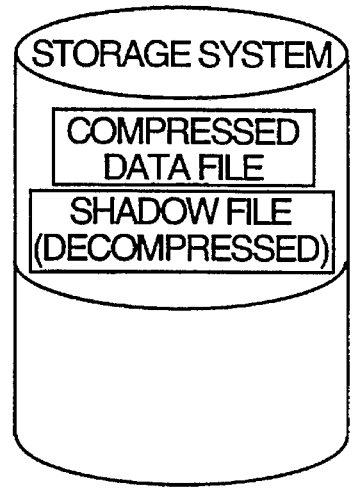
Figure 7C:
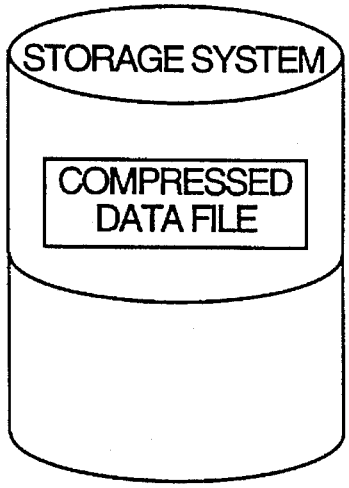
Figure 7F:
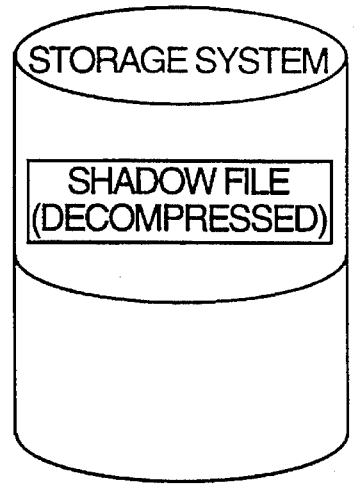

From block 524, operation passes to block 526, where the shadow means issues a request for the operating system to move the shadow file from the temporary location to the same location as the compressed data file, as seen in FIG. 7E. From block 526, operation passes to block 528, where the shadow means issues requests for the operating system to close and delete the original compressed data file, as seen in FIG. 7F.

From block 528, operation passes to block 530, where the data write request is handed off to the operating system, which performs the data write to the decompressed shadow file. If, at conditional block 522, it is determined that the file had already been decompressed, operation passes directly to block 530. In either case, the write is complete at node 532.

C. Date Read Request—File Shadowing Mode

FIG. 5C illustrates operation of the direct read means and the shadow means in response to a data read request from an application program at node 540. From there, operation continues at conditional block 542, where the shadow means determines whether the file has been decompressed.

If the file has not yet been decompressed, the file is still eligible for ordinary direct read usage, identical to that of the read-only direct read mode, as seen in FIG. 7A. Thus, operation passes to block 544, where the direct read means locates the appropriate blocks of the compressed data file. Then, operation continues at block 546, where the decompressor decompresses those blocks into RAM and copies the requested bytes into the application program's buffer.

If, at conditional block 542, it is determined that the file has already been decompressed, as seen in FIG. 7F, operation passes to block 548. At block 548, the shadow means issues a request for the operating system to read the indicated bytes from the decompressed shadow file. In either case, read operations are complete at node 550.

D. File Close Request—File Shadowing Mode

FIG. 5D illustrates operation of the shadow means and the direct read means in response to a file close request issued by the application program at node 560. From there, operation continues at conditional block 562, where the direct read means determines whether the file has been decompressed.

If it has not been decompressed, operation passes to block 564, where the shadow means issues requests for the operating system to close and delete the shadow file. Note that if the file was never decompressed, this is because it never became "dirty", or, in other words, it was never written to. The only thing which block 564 will delete is a garbage-containing placeholder shadow file.

From block 564, operation passes to block 566, where the direct read means issues a request for the operating system to close the open direct read file. Thus, although the file was opened for read/write permission, it was only used for reading. In this situation, the history of the files is described by the sequence: FIG. 7A, FIG. 7B, FIG. 7C.

If, at conditional block 562, the file was determined to have been decompressed (i.e. written to), operation passes to block 568. At block 568, the shadow means issues a request for the operating system to close the open decompressed shadow file. In this situation, the history of the files is described by the sequence: FIG. 7A, FIG. 7B, FIG. 7D, FIG. 7E, FIG. 7F. Note that the file is left in a decompressed state. The compressor may subsequently be used to re-compress the file, if desired. This process could, optionally, be incorporated into the close operation, by making the compressor an integral part of the direct read system.

In either case, file close operations are complete at node 570.

V. Operation of the Invention in File Putback Mode

FIGS. 6A–D illustrate file open, data write, data read, and file close operations of the direct read system when operating in file putback mode. In the interest of clarity, FIGS. 6A–D do not show conditional blocks determining whether the request involves a direct read file. It will be understood that, as in FIGS. 4A–D, if other than a direct read file is involved, the direct read system will hand off the request for normal operations by the operating system.

Direct read operations in file putback mode are performed by the direct read means, just as in normal read-only direct read mode. Additional features of file putback mode are provided by the putback means, and will be described below, with reference to FIGS. 6A–D and FIGS. 8A–F.

A. File Open Request—File Putback Mode

Figure 6A:
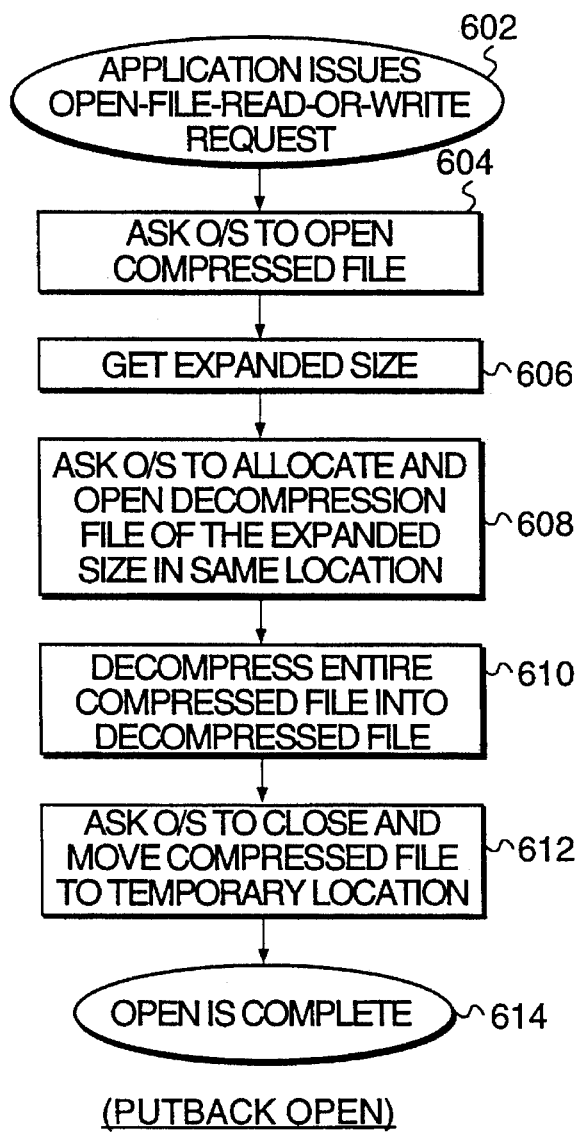

FIG. 6A shows operations of the direct read system in file putback mode. File putback mode is entered at node 602 when an application requests to open a file for read/write permission in circumstances indicating that the application will most likely write to the file.

Figure 8A:
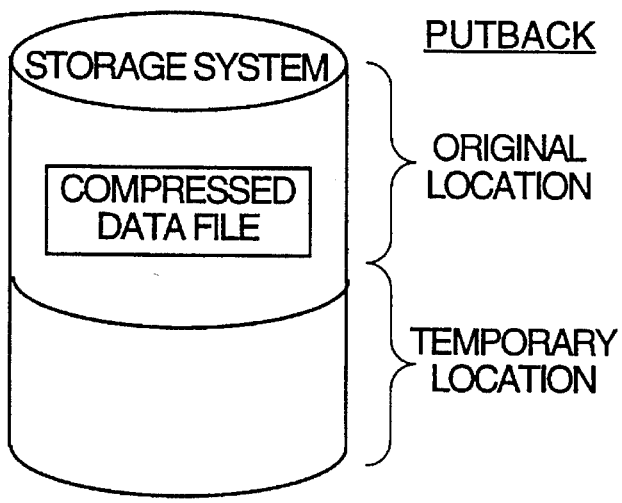
FIGS. 8A–F illustrate operation of the invention to create, decompress, and move files in the file putback mode.

At block 604, the direct read system issues a request for the operating system to open the compressed file. Then, at block 606, the putback means determines the decompressed (expanded) size of the entire file. FIG. 8A shows the compressed data file in its original location.

Then, at block 608, the putback means issues a request for the operating system to open a putback file of this decompressed size, in the same location. Then, operation continues at block 610, where the decompressor decompresses the entire data file into the putback file, as seen in FIG. 8B.

Figure 8D:
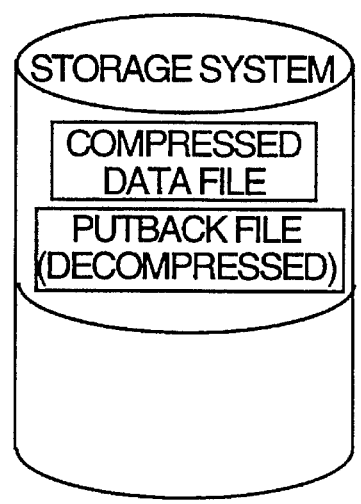
Figure 8B:
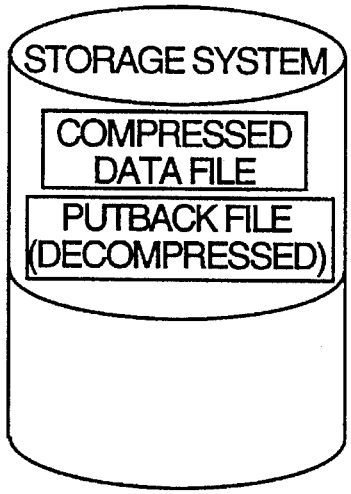
Figure 8E:
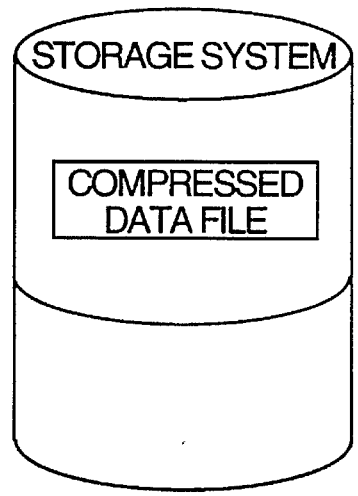
Figure 8C:
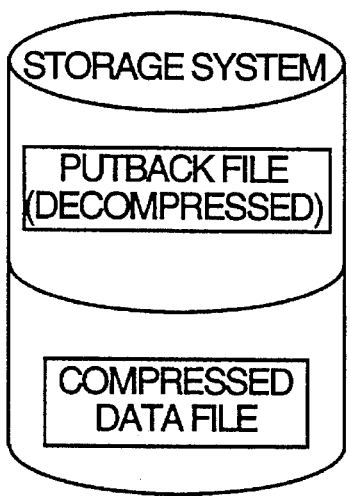

After decompression, operation passes to block 612, where the putback means issues requests for the operating system to close the original compressed data file and move it to the temporary location, as in FIG. 8C.

File open operations are complete at node 614.

B. Data Write Request—File Putback Mode

Figure 6B:
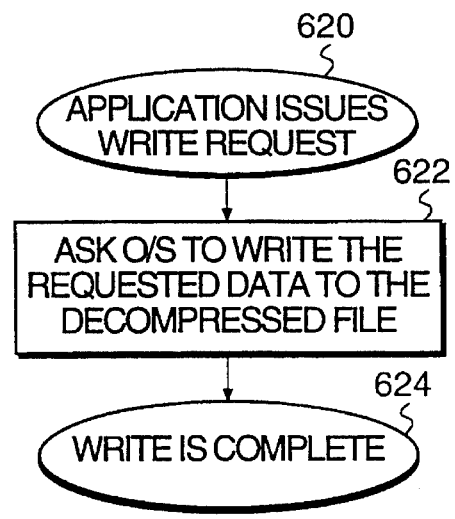

FIG. 6B illustrates operations of the putback means in response to a data write request issued by the application program at node 620. Operation passes to block 622, where the putback means issues a request for the operating system to write the indicated data to the decompressed putback file, rather than to the compressed data file as originally indicated by the application's request. Write operations are complete at node 624.

C. Date Read Request—File Putback Mode

Figure 6C:
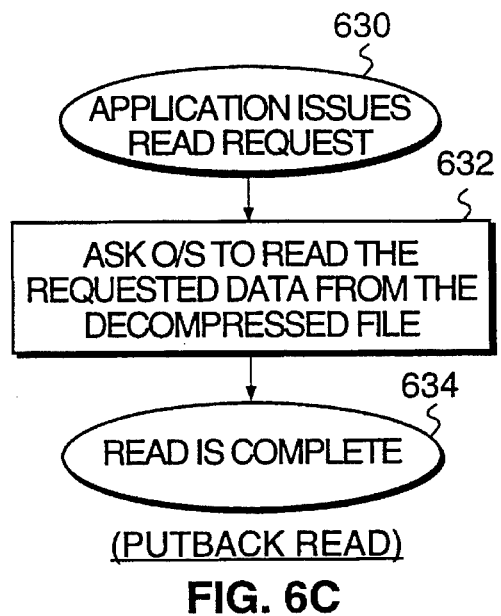

FIG. 6C illustrates operations of the putback means in response to a data read request issued by the application program at node 630. Operation passes to block 632, where the putback means issues a request for the operating system to read the indicated data from the decompressed putback file, rather than from the compressed data file. Read operations are complete at node 634.

D. File Close Request—File Putback Mode

Figure 6D:
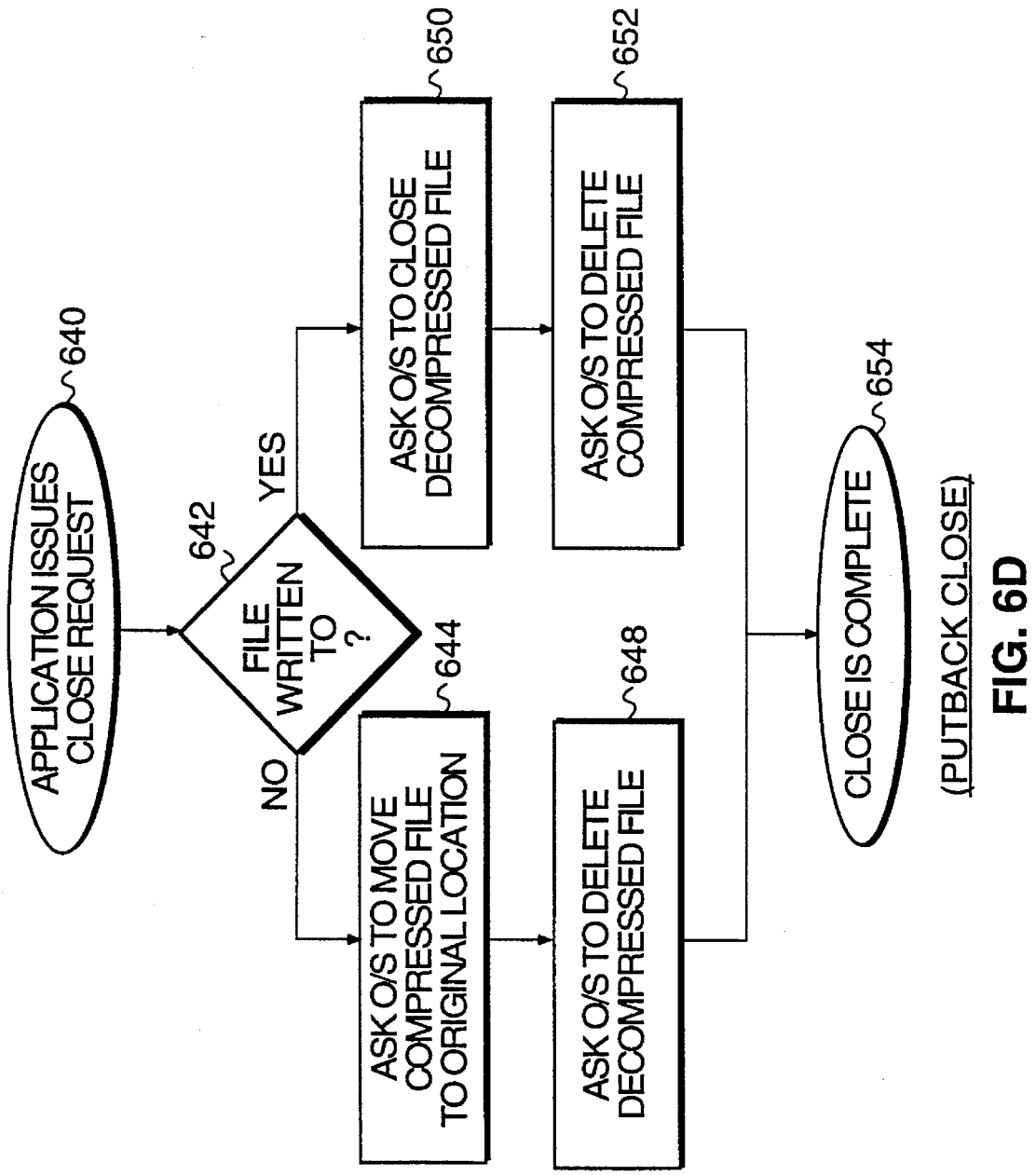

FIG. 6D illustrates operation of the putback means and direct read means in response to a file close request. At node 640, the application program issues the request. Operation continues at conditional block 642, where the putback means determines whether the file has been written to.

If the file has not been written to, operation passes to block 644, where the putback means issues a request for the operating system to move the compressed data file from the temporary location back to its original location, as seen in FIG. 8D. Then, at block 648, the putback means issues a request for the operating system to delete the decompressed putback file, as seen in FIG. 8E.

If the application did not write to the file, the history of the files is described by the sequence: FIG. 8A, FIG. 8B, FIG. 8C, FIG. 8D, FIG. 8E.

Figure 8F:
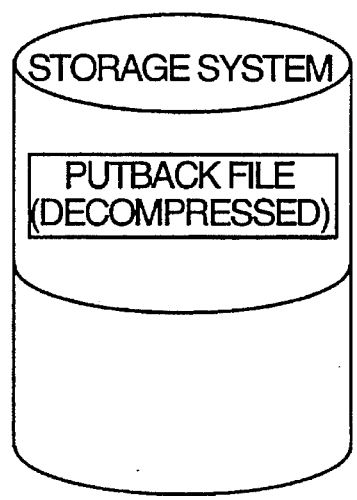

If, at conditional block 642, the putback means determines that the application program wrote to the file, operation passes to block 650, where the putback means issues a request for the operating system to close the open decompressed putback file. Then, at block 652, the putback means issues a request for the operating system to delete the compressed data file from the temporary location, as seen in FIG. 8F.

If the application wrote to the file, the history of the files is described by the sequence: FIG. 8A, FIG. 8B, FIG. 8C, FIG. 8F.

Thus, what is "put back" into the original location will be either the original compressed data file or the decompressed data file, depending on whether the application program wrote any data to the file. In either case, file close operations are complete at node 654.

VI. Caching

It is highly undesirable that the apparatus and method would have to fetch and decompress an entire block of data each time an application program requested a single byte, for example.

FIG. 1 shows that, in order to prevent this, the direct read system includes caching means 160 for storing one or more decompressed data blocks for each open file.

FIG. 2 illustrates This feature. The first time an application program requests data from a file, the direct read means must rely on the operating system to fetch a compressed block from the permanent storage medium, and must further rely on the decompressor to decompress the block into an output buffer. Then, the requested data are provided to the application program by the direct read system.

On a subsequent request for data in the same block, the direct read system need not invoke the operating system nor the decompressor, because the block will already be stored in a decompressed form in one of the particular file's cache blocks. Thus, the direct read system receives the data read request, and immediately provides the requested data to the application program from the cache block.

In one mode, a block is cached only if both: it is the last block involved in a data request, and it contains data beyond that requested. In other words, a block is cached if at least one byte in the block's latter portion was not yet requested. This mode is selected based upon the likelihood that once an application program has accessed an entire data block, the application program is less likely to make subsequent requests for the same data again. It is further selected based upon the likelihood that, once an application program has requested given data in a block, there is a high likelihood that immediately subsequent data in the block will later be requested by the application program.

In one mode, up to twelve cache blocks are maintained for each file, as needed. It is believed unlikely that an application program will read partial blocks from more than twelve locations in a file, in a manner such that caching of additional blocks would be advantageous.

VII. Access to Individual Blocks

A. Use of Block Tables

As shown in FIG. 9, and according to the file format taught in the cross-referenced applications, a compressed data file includes a block table which provides access to the individual blocks of the compressed data file.

Although each compressed block represents the same quantity of non-compressed data, such as eight kilobytes, each compressed block does not necessarily include the same quantity of compressed data.

Therefore, the block table entries may contain offsets from a predefined reference point to the beginnings of the respective compressed data blocks. The offsets may be measured from the beginning of the file as a whole, for example. Thus, in response to a data read request specifying "read X bytes starting at location Y in file Z", the data structure means 134 and the locator means 136 may access the block table of file Z to gain access to the particular blocks effectively containing bytes Y through Y+X−1 of the file.

In one mode, the data structure means 134 and the locator means 136 may sequentially scan the block table entries until it finds the block containing byte Y, and the block containing byte Y+X−1. The data structure means and the locator means must, of course, take into account the size of the global file header, if the block table entries indicate offsets from the absolute beginning of the file, rather than from the beginning of block 0.

It will be understood that, if the data access request specifies less than the entire data file, the locator means may identify less than all blocks in the compressed data file. The decompressor will then selectively decompress only those identified blocks, without decompressing other, non-specified blocks.

In one mode, the block table merely points to the beginning locations of the respective blocks. In this mode, the data structure means and the locator means must further consult the block headers to determine how much non-compressed data each block effectively holds, in order to determine what blocks are involved in a given data access request. In another mode, the block table entries may each further include a copy of the expanded data size field from the corresponding block header. In this mode, the data structure means and the locator means need not consult the block headers in order to build data structures providing access to the respective blocks.

As is explained in the cross-referenced applications, the block table can be reconstructed if that portion of the file is damaged. The global file header is a known, fixed size. Therefore, the block header for block 0 begins at a known, fixed position in the file. Block header 0 contains a field indicating the compressed size of block 0. Therefore, the location of the beginning of block header 1 can readily be determined, and so forth. Therefore, the locator means may include means for reconstructing a damaged block table from the block headers.

As is further indicated in the cross-referenced applications, each block header includes checksums generated over both the block and the block header itself. This information may be utilized to reconstruct at least some portions of a block table which has been damaged, even if one or more of the blocks and block headers have been damaged. Therefore, the locator means may include means for reconstructing some or most of a damaged block table from damaged blocks and block headers.

B. Data Structures

Those skilled in the art will appreciate that the following description of the source code and of the data structures is for teaching purposes only, and that the source code speaks for itself.

As is seen in the attached Software Source Code Appendix, each direct read file will have an associated "FileStruct" which contains the data structure entries for the particular file. Each "FileStruct" includes "DRCommonItems", and may optionally include other items as well.

The FileStruct structures for read-only direct read files and shadow files are stored in a doubly-linked list, as indicated by the items "*next" and "*prev" in "DRCommonItems". Putback files and their associated compressed data files are handled within a simple array (not shown), which is kept separate from the direct read and shadow files for purposes of speed. Other modes are, of course, feasible within the scope of this invention. When a direct read file is opened, the data structure means creates for it a "FileStruct" and adds it to the doubly-linked list.

The item "algorithm" indicates whether the file is compressed, and if so, by what method. When a direct read file is opened, the data structure means sets the "algorithm" item according to what compression method was used, as indicated by the file's global file header.

The items "logicalEOF" and "logicalFPos" are used to keep track of where the application program thinks it is in a non-compressed data file. These values are used and updated by the direct read means and the shadow means.

The item "shadowFileRef" ties a direct read file to a shadow file. The item "compFileRef" ties a shadow file back to its compressed data file. These values are used and set by the shadow means.

The item "ddHeader" is filled by the data structure means according to a global file header in a given direct read file, and can be understood from the cross-referenced applications. The shadow means uses a "expSize" field from the "ddHeader" to determine how large a shadow file the operating system should be requested to create.

The item "**offsets" is a handle to a "PairOffsetsStruct", and is filled by the data structure means according to the offsets table of the particular direct read file. Specifically, the item "offsets[]" is a dynamically-allocated array of offsets to the various data blocks. The locator means uses the "offsets[]" to identify which compressed block(s) in a file are involved in a given data access request.

The item "cacheList" points to a doubly-linked list of cache blocks for the file, and is maintained and used by the caching means. Each cache block is contained in a "CacheBlock" as shown. The cache blocks for a given file are stored in a doubly-linked list by the items "next" and "prev". The cached block's bytes are stored in the dynamically-allocated item "bytes[]".

The usage of the other items will be understood from the source code itself.

VIII. Conclusion

While the invention has been described with reference to the embodiment of a data compression system, its use in any suitable embodiment is contemplated. Various aspects of the invention's cooperation with an operating system may be incorporated directly into the direct read system itself. For example, the direct read system could directly move or delete files, rather than using the more conventional method of using an available operating system. It will also be understood that the terms "application program" and "operating system" may be used somewhat interchangeably.

These and various other changes in the form and details discussed herein are possible within the scope of this disclosure, including but not limited to those discussed above. However, the invention is to be afforded protection according to the scope of the following claims.

METHOD AND APPARATUS FOR PERFORMING
DIRECT READ OF COMPRESSED DATA FILE

Inventor:
Lloyd Lamont Chambers IV

SOFTWARE SOURCE CODE APPENDIX

Copyright 1991 Salient Software, Inc.
All Rights Reserved Except as Otherwise Disclaimed

```
/*    ©1991 Salient,
**    All Rights Reserved
**
**    Salient Software, Inc.
**    124 University Ave., Suite 300
**    Palo Alto, CA    94301
**       (415)-321-5375
*/

/* The structure that describes the number and offsets to blocks.
** Keep this structure a multiple of 4 bytes! */
typedef struct
{ ulong  numBlocks;
  ulong  numBlocks2;
  ulong  blockSize;    /* or 0 for default */
  uchar  offsetsChecksum;
  uchar  unused[3];
  long   offsets[];
} PairOffsetsStruct;

/* The header that precedes compressed data.
** IMPORTANT: Keep the size of this structure a multiple of 4 bytes */
typedef struct
{ ushort  compSize;
  ushort  expSize;
  ulong   futureUse;
  uchar   compDataChecksum;
  uchar   reserved : 2;
  uchar   repaired : 1;   /* was this block repaired? */
  uchar   compressorUsed : 2;  /* if Pairs, which compressor was used */
  uchar   compSizePad : 2; /* true compressed size is 'compSize' - 'compSizePad' */
  uchar   copied : 1;  /* set if the data was copied instead of compressed */
  uchar   expDataChecksum; /* optional */
  uchar   headerChecksum;
} BlockHeader;

enum
{ DirectReadKind = 3,
  ShadowKind
};

#define DRCommonItems \
  union _FileStruct_  *next;\
  union _FileStruct_  *prev;\
  short   fileRef;\
  short   kind;\
  Boolean closed;\
  Boolean naughty; \
  Boolean allowAsync;\
  Boolean shadowHosed;\
  OSType  appType;\
  uchar   appName[32];\
  short   appRefNum;

typedef struct _CacheBlock_
{ struct _CacheBlock_  **next;
  struct _CacheBlock_  **prev;
  long   index;  /* < 0 if invalid */
  uchar  bytes[];  /* of appropriate size */
} CacheBlock, **CacheBlockHandle;
```

```
/* Direct Read files */
typedef struct
{ DRCommonItems
   ushort  algorithm : 8;    /* NoCompression, PairsCompression, PairsSortCompression */
   ushort  resourceFork : 1; /* TRUE if this is a resource fork */
   ushort  unused : 7;
   ulong   noCompressionOffset; /* where to start reading if raw data */
   ulong   logicalEOF;
   ulong   logicalFPos;
   long    blockSize;
   short   shadowFileRef; /* file ref num of shadow file */
   ulong   lastAccessTime;
   DDHeader  ddHeader;
   PairOffsetsStruct  **offsets;
   ulong   cacheSize;
   short   numCacheBlocks;
   CacheBlockHandle  cacheList;
} DRFileStruct, *DRFilePtr;

typedef struct
{ DRCommonItems
   short   dataForkRef;
   short   resForkRef;
   Boolean ourDataFork; /* TRUE if it's only us who owns fork */
   Boolean ourResFork;  /* TRUE if it's only us who owns fork */
   short   compFileRef;
} ShadowFileStruct, *ShadowFilePtr;

typedef struct
{ DRCommonItems
} CommonFileStruct;

/* generic type shared between OpenFileStruct, ShadowFileStruct */
typedef union _FileStruct_
{ CommonFileStruct  common;
  DRFileStruct  drFile;
  ShadowFileStruct  shadowFile;
} FileStruct, *FilePtr;

OSErr
DirectReadInit()
{ OSErr  err;
  ulong  inSize, outSize;
  HaveFlushTrap = TrapAvailable(_HWPriv);
  err = DLInit(); /* allocate this first because it will never move! */
  if (err != noErr)
    return(err);
  inSize = PAIRS_MAX_COMP_SIZE(PAIRS_MAX_BLOCK_SIZE);
  outSize = PAIRS_MAX_BLOCK_SIZE + PAIRS_MAX_OVERWRITE;
  ReserveMem(outSize); /* enough to accomodate a whole block + spillover */
  TempOutPtr = NewPtr(outSize);
  err = TempInInit(inSize);
  if (err != noErr)
    return(err);
  return(noErr);
} /* routine DirectReadInit */

OSErr
ReadAtOffset(short fileRef, long *count, uchar *buffer, long offset)
{ OSErr  err;
  err = SetFPosAD(fileRef, fsFromStart, offset);
  if (err != noErr)
    return(err);
  err = FSReadAD(fileRef, count, buffer);
  return(err);
} /* routine ReadAtOffset */
```

```
/* Things to check: (1) file already open writable or shared (2) volume locked */
OSErr
DirectSetupForFileRef(short fileRef, Boolean resourceFork, DRFilePtr *result)
{ DRFilePtr info;
  OSErr  err;
  DDHeader  header;
  ulong  count;
  BlockOffsetsStruct  **offsets;
  ulong  offsetsSize;
  ulong  pos;
  ulong  dataLength;
  short  alg;
  *result = NIL;
  /* read the main file header */
  count = sizeof(header);
  err = FSReadAD(fileRef, (long *)&count, &header);
  if (err != noErr)
    return(err);
  /* Now check to see if this file is appropriate or not */
  if ((err = DirectCanRead(&header)) != noErr)
    return(err);
  if (resourceFork)
  { dataLength = header.resForkLength;
    alg = header.resAlgorithm;
  }
  else
  { dataLength = header.dataForkLength;
    alg = header.dataAlgorithm;
  }
  if (dataLength == 0)
    alg = NoCompression;
  info = (void *)DLAllocFile();
  if (info == NIL)
  { MakeMoreMemory(sizeof(FileStruct));
    info = (void *)DLAllocFile();
    if (info == NIL)
      return(mFulErr); /* File Managers' mFulErr, not mem mgr's memFullErr */
  }
  (*info).kind = DirectReadKind;
  (*info).algorithm = alg;
  (*info).resourceFork = resourceFork;
  (*info).ddHeader = header;
  (*info).fileRef = fileRef;
  /* set default block sizes */
  if (alg == PairsCompression)
  { (*info).blockSize = PAIRS_DLT_BLOCK_SIZE;
    (*info).cacheSize = PAIRS_DLT_BLOCK_SIZE + PAIRS_MAX_OVERWRITE;
  }
  else if (alg == PairsSortCompression)
  { (*info).blockSize = PAIRS_SORT_BLOCK_SIZE;
    (*info).cacheSize = PAIRS_SORT_BLOCK_SIZE + PAIRS_MAX_OVERWRITE;
  }
  (*info).logicalEOF = dataLength;
  if ((*info).logicalEOF == 0)  /* an empty fork */
  { pos = 0;
    offsetsSize = 0;
  }
  else if ((*info).algorithm == NoCompression)
  { pos = sizeof(DDHeader);  /* read the length */
    if (resourceFork)
      pos += header.compDataForkLength;
    offsetsSize = 0; /* one long for start of data */
  }
  else  /* regular case */
  { pos = sizeof(header) + header.compDataForkLength -
          sizeof(long); /* read length */
```

```
     if (resourceFork)
        pos += header.compResForkLength;
     count = sizeof(offsetsSize);
     err = ReadAtOffset((*info).fileRef, (long *)&count,
                       (void *)&offsetsSize, pos);
     if (err != noErr)
     { DLFreeFile((FilePtr)info);
       return(err);
     }
  }
  count = offsetsSize;
  offsets = (void *)NewHandle(offsetsSize);
  if (offsets == NIL)
  { MakeMoreMemory(offsetsSize);
    offsets = (void *)NewHandle(offsetsSize);
  }
  (*info).offsets = offsets;
  if ((err != noErr) || (offsets == NIL))
  { DLFreeFile((FilePtr)info);
    return(memFullErr);
  }
  if(dataLength != 0 && ((*info).algorithm == NoCompression))
     (*info).noCompressionOffset = pos;
  else if (dataLength != 0)   /* normal compressed case */
  { uchar offsetsChecksum;
    pos -= offsetsSize;   /* reposition to read the offsets */
    err = ReadAtOffset((*info).fileRef, (long *)&count, (void *)*offsets, pos);
    if (err != noErr)
    { DisposHandle(offsets);
      DLFreeFile((FilePtr)info);
      return(err);
    }
    /* check to see if offsets are valid */
    offsetsChecksum = 0;
    ComputeXORChecksum((void *)&(**offsets).offsets[0],
            offsetsSize - sizeof(**offsets), &offsetsChecksum);
    if (offsetsChecksum != (**offsets).offsetsChecksum)
    { DisposHandle(offsets);
      DLFreeFile((FilePtr)info);
      return(checksumError);
    }
  } /* else */
  /* If there is a block size specified, use it instead of default. */
  if ((**offsets).blockSize != 0)
  { Boolean badBlockSize = FALSE;
    (*info).blockSize = (**offsets).blockSize;
    if (alg == PairsCompression)
    { if ((**offsets).blockSize != PAIRS_DLT_BLOCK_SIZE)
         badBlockSize = TRUE;
      (*info).cacheSize = (**offsets).blockSize + PAIRS_MAX_OVERWRITE;
    }
    else if (alg == PairsSortCompression)
    { if ((**offsets).blockSize > PAIRS_MAX_BLOCK_SIZE)
         badBlockSize = TRUE;
      (*info).cacheSize = (**offsets).blockSize + PAIRS_MAX_OVERWRITE;
    }
    if (badBlockSize)
    { DirectClose(info);
      return(internalError);
    }
  }
  TempInRealloc(PAIRS_MAX_BLOCK_SIZE*2L); /* try to leave enough for about 2 files */
  *result = info;
  return(noErr);
} /* routine DirectSetupForFileRef */
```

```
OSErr
DirectClose(DRFilePtr file) /* caller should take care of closing file */
{ if ((*file).kind != DirectReadKind)
    return(-1);
  TempInFlush(file);
  if ((*file).offsets != NIL)
    DisposHandle((*file).offsets);
  DisposeCacheBlocks(file);
  Nullify(file, sizeof(*file));
  DLFreeFile((FilePtr)file);
  return(noErr);
} /* routine DirectClose */

/* Read bytes from the file. Shouldn't be called directly, because it does not
** account for newline mode or other variations in paramater block. */
OSErr  _DirectRead(DRFilePtr file, long *count, uchar *destBuffer);

OSErr DirectRead(DRFilePtr file, long *count, uchar *destBuffer)
  { OSErr err;
    err = _DirectRead(file, count, destBuffer);
    if (HaveFlushTrap)
      FlushInstructionCache(); /* flushes both caches on an MC68040 */
    return(err);
  } /* nested routine DirectRead */ static OSErr
_DirectRead(DRFilePtr file, long *count, uchar *destBuffer)
{ ulong  startLogPos;
  long   blockIndex, firstBlock, lastBlock;
  long   destBufferAvail;
  long   destBufferUsed;
  OSErr  err;
  Boolean mustReturnEOF = FALSE;
  if (*count == 0)  /* handle stupid case */
    return(noErr);
  if ((*file).logicalEOF == 0)  /* empty file */
  { *count = 0;
    return(eofErr);
  }
  startLogPos = DirectGetFPos(file);
  /* If the read would go beyond the EOF, read as much as we can,
  ** but return an eofErr. */
  if (startLogPos + *count > DirectGetEOF(file))
  { *count = 0;
    if (startLogPos < DirectGetEOF(file))
      *count = DirectGetEOF(file) - startLogPos;
    mustReturnEOF = TRUE;
  }
  if ((*file).algorithm == NoCompression)  /* read raw uncompressed data */
  { err = ReadAtOffset((*file).fileRef, count, destBuffer,
            startLogPos + (*file).noCompressionOffset);
    DirectSetFPos(file, startLogPos + *count);
    if (mustReturnEOF)
      return(eofErr);
    return(err);
  }
  firstBlock = startLogPos / (*file).blockSize;
  lastBlock = (startLogPos + (*count) -1) / (*file).blockSize;
  destBufferAvail = *count;
  destBufferUsed = 0;
  (*file).lastAccessTime = AccessTime++;
  /* read all the bytes in all the blocks */
  for (blockIndex = firstBlock; blockIndex <= lastBlock; ++blockIndex)
```

```
{ uchar   *dest;
  long    fromOffset;
  long    advanceCount;
  uchar   *data;
  Boolean moveData;
  CacheBlockHandle cacheBlock;
  fromOffset = (startLogPos + destBufferUsed) % (*file).blockSize;
  advanceCount = (*file).blockSize - fromOffset;
  if (advanceCount > destBufferAvail)
    advanceCount = destBufferAvail;
  moveData = TRUE;
  /* fetch the data in this block */
  if ((cacheBlock = CacheValid(file, blockIndex)) != NIL)
    data = &(**cacheBlock).bytes[0];
  else
  { data = TempOutPtr;
    /* if a partial block and it's the last one, put it into the cache */
    if ((blockIndex == lastBlock) && (advanceCount != (*file).blockSize))
    { cacheBlock = DirectReallocCache(file);
      if (cacheBlock != NIL)
      { (**cacheBlock).index = blockIndex;
        data = &(**cacheBlock).bytes[0];
      }
    }
    err = TempInGetBlock(file, blockIndex, lastBlock, data);
    if (err != noErr)
      return(err);
  } /* else */
  if (moveData)
    MyBlockMove(data + fromOffset, destBuffer + destBufferUsed,
         advanceCount);
  destBufferAvail -= advanceCount;
  destBufferUsed += advanceCount;
  DirectSetFPos(file, startLogPos + destBufferUsed);
} /* for */
if (mustReturnEOF)
  return(eofErr);
return(noErr);
} /* routine DirectRead */

OSErr
DirectSetFPos(DRFilePtr file, ulong newPos)
{ if (newPos > DirectGetEOF(file))
  { (*file).logicalFPos = DirectGetEOF(file);
    return(eofErr);
  }
  (*file).logicalFPos = newPos;
  return(noErr);
} /* routine DirectSetFPos */ ulong
DirectGetFPos(DRFilePtr file)
{ return((*file).logicalFPos);
} /* routine DirectGetFPos */ ulong
DirectGetEOF(DRFilePtr file)
{ return((*file).logicalEOF);
} /* routine DirectGetEOF */
```

```
static DRFilePtr
FindOldestFileWithCache(ulong minCacheSize)
{ DRFilePtr  oldestFile = NIL;
  DRFilePtr  cur;
  cur = (void *)DLGetList();
  while (cur != NIL)
  { DRFilePtr  file;
    file = (void *)cur;
    if ((*cur).kind == DirectReadKind &&
        (*file).numCacheBlocks != 0 &&
        (*file).cacheSize >= minCacheSize)
    { if (oldestFile == NIL)
        oldestFile = file;
      else if ((*file).lastAccessTime < (*oldestFile).lastAccessTime)
        oldestFile = file;
    }
    cur = (void *)cur->next;
  } /* while */
  return(oldestFile);
} /* routine FindOldestFileWithCache */

/* Memory is needed. Purge cache blocks until enough is available.
** This is a slow, expensive operation and should be called only if necessary. */
void
DirectPurgeCaches(ulong requiredBlock)
{ while (MaxBlock() < requiredBlock)
  { DRFilePtr  oldestFile;
    CacheBlockHandle  cacheBlock;
    oldestFile = FindOldestFileWithCache(0);
    if (oldestFile == NIL)
      break;
    DisposeCacheBlocks(oldestFile); /* ahhh...trash them all for speed */
  }
} /* routine DirectPurgeCaches */

/* find oldest (last) cache block in the list */
static CacheBlockHandle
GetOldestCacheBlock(DRFilePtr file, Bcolean remove)
{ CacheBlockHandle  cur, last;
  cur = last = (*file).cacheList;
  while (cur != NIL)
  { last = cur;
    cur = (**cur).next;
  }
  if (last != NIL && remove)
  { CacheBlockHandle  prev;
    prev = (**last).prev;
    if (prev != NIL)
      (**prev).next = NIL;
    else
      (*file).cacheList = NIL;
    (*file).numCacheBlocks--;
  }
  return(last);
} /* routine GetOldestCacheBlock */
```

```
/* Allocate another cache block for this file if possible.
** Return its index, or -1 if not possible.
*/
static CacheBlockHandle
DirectReallocCache(DRFilePtr  file)
{ CacheBlockHandle  newBlock;
  if ((*file).numCacheBlocks == MAX_CACHE_BLOCKS)
    /* If we already have the max num of cache blocks, use the oldest one */
    newBlock = GetOldestCacheBlock(file, TRUE);
  else
  { ulong allocSize = (*file).cacheSize + sizeof(CacheBlock);
    newBlock = NewHandle(allocSize);
    if (newBlock == NIL)
    { TempInRealloc(allocSize);
      newBlock = NewHandle(allocSize);
    }
    if (newBlock == NIL)   /* take cache away from other file */
    { DirectPurgeCaches(allocSize);
      newBlock = NewHandle(allocSize);
    }
  } /* else */
  if (newBlock == NIL)
    return(NIL);
  /* insert new cache block at front of list */
  if ((*file).cacheList != NIL)
    (**(*file).cacheList).prev = newBlock;
  (**newBlock).next = (*file).cacheList;
  (**newBlock).prev = NIL;
  (*file).cacheList = newBlock;
  (*file).numCacheBlocks++;
  return(newBlock);
} /* routine DirectReallocCache */ static CacheBlockHandle
CacheValid(DRFilePtr  file, long blockIndex)
{ register CacheBlockHandle  cur;
  cur = (*file).cacheList;
  while (cur != NIL)
  { if ((**cur).index == blockIndex)  /* move this one to front of list */
    { if (cur != (*file).cacheList)  /* remove cur from list */
      { (**(**cur).prev).next = (**cur).next;
        if ((**cur).next != NIL)
          (**(**cur).next).prev = (**cur).prev;
        (**cur).next = (*file).cacheList;  /* insert cur at front... */
        (**(*file).cacheList).prev = cur;
        (**cur).prev = NIL;
        (*file).cacheList = cur;
      }
      return(cur);
    }
    cur = (**cur).next;
  } /* while */
  return(NIL);
} /* routine CacheValid */
```

```
static void
DisposeCacheBlocks(DRFilePtr file)
{ register CacheBlockHandle  cur;
  cur = (*file).cacheList;
  while (cur != NIL)
  { CacheBlockHandle  temp;
    temp = (**cur).next;
    DisposHandle(cur);
    cur = temp;
  }
  (*file).cacheList = NIL;
  (*file).numCacheBlocks = 0;
} /* routine DisposeCacheBlocks */ void
MakeMoreMemory(ulong   requiredSpace)
{ /* next, get rid of excessive size input buffer */
  if (MaxBlock() < requiredSpace)
  { TempInForceToMin();
    /* finally, get rid of caches until we have enough space */
    if (MaxBlock() < requiredSpace)
      DirectPurgeCaches(requiredSpace);
  }
} /* routine MakeMoreMemory */ typedef struct
{ Boolean  busy;
  short    unused;   /* to keep 4-byte aligned */
  ulong    size;
  ulong    minSize;
  long     startBlockIndex;
  long     stopBlockIndex;
  DRFilePtr  file;
  uchar    **bytes;
} TempInStruct;
static TempInStruct  TempIn;
static Boolean  Have68020;

void  _TempInFlush(DRFilePtr  file);

OSErr
  TempInInit(ulong   minSize)
  { long result;
    Have68020 = FALSE;
    if (Gestalt(gestaltProcessorType, &result) == noErr)
      Have68020 = (result >= gestalt68020);
    TempIn.size = minSize;
    TempIn.minSize = minSize;
    ReserveMem(minSize);
    TempIn.bytes = NewHandle(minSize);
    if (TempIn.bytes != NIL)
      HLock(TempIn.bytes);
    return((TempIn.bytes != NIL) ? noErr:memFullErr);
  } /* nested routine TempInInit */
```

```
/* Increase size of TempIn, leave at least 'leaveFreeAmount' bytes. */
OSErr
 TempInRealloc(long  leaveFreeAmount)
{ long  maxBlock;
  long  maxSize;
  long  newSize;
  if (TempIn.busy)
    return(fBsyErr);
  /* don't bother if it's already as small as possible */
  if (TempIn.minSize == TempIn.size)
    return(noErr);
  TempIn.busy = TRUE;
  _TempInFlush(TempIn.file);
  /* get rid of excess data */
  HUnlock(TempIn.bytes);
  SetHandleSize(TempIn.bytes, TempIn.minSize);
  TempIn.size = GetHandleSize(TempIn.bytes);
  newSize = TempIn.minSize;
  maxBlock = MaxBlock();
  if (maxBlock > leaveFreeAmount)
    newSize = maxBlock - leaveFreeAmount;
  if (newSize > 128L * 1024L)
    newSize = 128L * 1024L;
  if (newSize > TempIn.minSize)
  { SetHandleSize(TempIn.bytes, newSize);
    TempIn.size = GetHandleSize(TempIn.bytes);
  }
  HLock(TempIn.bytes);
  TempIn.busy = FALSE;
  return(noErr);
} /* nested routine TempInRealloc */

OSErr
 TempInForceToMin()
{ return(TempInRealloc(1024L * 1024L));
}

/* flush without checking busy flag */
static void
_TempInFlush(DRFilePtr  file)
{ if (file == NIL || TempIn.file == file)
  { TempIn.startBlockIndex = -1;
    TempIn.stopBlockIndex = -1;
    TempIn.file = NIL;
  }
} /* routine _TempInFlush */

OSErr
TempInFlush(DRFilePtr file)
{ if (TempIn.file == file)
  { if (TempIn.busy)
     return(fBsyErr);
    TempIn.busy = TRUE;
    _TempInFlush(file);
    TempIn.busy = FALSE;
  }
  return(noErr);
} /* routine TempInFlush */
```

```
OSErr
TempInGetBlock(DRFilePtr file, long desiredIndex, long lastDesiredIndex, uchar *block)
{ long    readStartPos;
  long    count;
  OSErr   err;
  long    index;
  uchar   *inBuf;
  if (TempIn.busy)
    return(fBsyErr);
  TempIn.busy = TRUE;
  readStartPos = (**(*file).offsets).offsets[desiredIndex];
  if (TempIn.file == file &&
      desiredIndex >= TempIn.startBlockIndex &&
      desiredIndex <= TempIn.stopBlockIndex)  /* block already in our cache */
  { ulong  offset;
    offset = readStartPos - (**(*file).offsets).offsets[TempIn.startBlockIndex];
    inBuf = &(*TempIn.bytes)[offset];
  }
  else  /* must read fresh data */
  { uchar checksum;
    BlockHeader *blockHeader;
    _TempInFlush(TempIn.file);  /* reset now in case of failure */
    /* figure out how many blocks we can read into buffer and still fit */
    index = desiredIndex;
    count = 0;
    while (index <= lastDesiredIndex)
    { long newCount;
      newCount = (**(*file).offsets).offsets[index+1] - readStartPos;
      if (newCount > TempIn.size)
        break;
      count = newCount;
      ++index;
    }
    --index;
    err = ReadAtOffset((*file).fileRef, &count, *TempIn.bytes, readStartPos);
    if (err != noErr)
    { TempIn.busy = FALSE;
      return(err);
    }
    TempIn.startBlockIndex = desiredIndex;
    TempIn.stopBlockIndex = index;
    TempIn.file = file;
    inBuf = &(*TempIn.bytes)[0];
    checksum = 0;  /* check to see if header is valid */
    blockHeader = (void *)inBuf;
    ComputeXORChecksum((void *)blockHeader,
        sizeof(BlockHeader) - sizeof(blockHeader->headerChecksum), &checksum);
    if (checksum != blockHeader->headerChecksum)
    { TempIn.busy = FALSE;
      return(checksumError);
    }
  } /* else */
  if (((*file).algorithm == PairsCompression ||  /* decompress the block */
       (*file).algorithm == PairsSortCompression)
  { if (Have68020)
      err = PairsDecompressBlock68020((PairsBlockHeader *)inBuf,
          inBuf + sizeof(PairsBlockHeader), block);
    else
      err = PairsDecompressBlock68000((PairsBlockHeader *)inBuf,
          inBuf + sizeof(PairsBlockHeader), block);
  }
  TempIn.busy = FALSE;
  if (err != noErr)
    return(err);
  return(noErr);
} /* routine TempInGetBlock */
```

I claim:

1. A machine-implemented method of providing non-compressed data to a requestor from a compressed data file in response to a data request sent by the requestor, the data request identifying the desired non-compressed data in terms of where the desired non-compressed data resides within a non-compressed version of the data file, wherein the compressed data file is held in a storage means having a predefined storage structure, the method comprising the steps of:

(a) obtaining the compressed data file from a block-oriented compressor that restarts its compression process after having compressed a predefined block of bits of the non-compressed version of the data file;

(b) generating an index structure that identifies restart points within the compressed data file at which the block-oriented compressor restarted its compression process, said restart points within the compressed file varying as a function of compression efficiency for each of said predefined block of bits;

(c) using the index structure to identify, within the compressed data file, the location of a compressed data portion which corresponds to the non-compressed data identified by the data request when the identified compressed data portion comprises less than all data in the compressed data file;

(d) fetching the identified, compressed data portion from the storage means;

(e) decompressing the fetched, compressed data portion to reconstitute the corresponding non-compressed data; and (f) providing the reconstituted non-compressed data to the requestor in response to the data request.

2. The method of claim 1 wherein the steps (c), (d) and (e) of using, fetching and decompressing respectively include the substeps of:

(c.1) using the index structure to identify, within the compressed data file, the location of a compressed data block containing said compressed data portion;

(d.1) fetching from the storage means the identified compressed block of data containing said compressed data portion; and (e.1) decompressing the fetched, compressed data block to thereby reconstitute the corresponding non-compressed data block containing said compressed data portion;

said method further comprising the steps of:

(g) caching the reconstituted non-compressed data block;

(h) keeping track of what reconstituted non-compressed data block has been cached, said tracking being in terms of where the reconstituted non-compressed data block resides within a non-compressed version of the data file;

(i) in response to a second, subsequent data request that seeks second data already within the cached data block, where the second request identifies the secondly desired data in terms of where a non-compressed version of the secondly desired data resides within the non-compressed version of the data file, determining from said tracking step that the secondly desired data is available within the cache; and (j) obtaining the secondly desired data directly from the cache instead of repeating said fetching and decompressing steps (d and e).

3. The method of claim 2 wherein said step (g) of caching the reconstituted non-compressed data block includes:

(g.1) determining whether the reconstituted non-compressed data block contains more data than that which was requested by the first request; and (g.2) caching the reconstituted non-compressed data block only if it contains more data than that which was requested by the first request.

4. The method of claim 3 wherein said step (g) of caching includes, for a plurality of subsequent requests each seeking a subportion of data in another block that is not yet decompressed and cached, (g.3) decompressing and caching the plurality of other blocks.

5. The method of claim 3 wherein said step (g.3) of multiple caching includes limiting the number of cached blocks to a predefined maximum, and when the maximum is reached purging the oldest cached block and replacing it with the newest block to be cached.

6. The method of claim 1, wherein the method is performed by a computer system having a data processing unit operatively coupled to a relatively fast random access memory (RAM) and having a slower mass storage means storing the compressed data file, and wherein the fetching step (d) includes fetching the identified, compressed data portion from the mass storage means and storing the fetched data portion in the faster random access memory (RAM);

wherein the decompressing step (e) includes using the data processing unit to decompress the fetched, compressed data portion that is stored in RAM; and wherein the providing step (f) includes using the data processing unit to extract from the reconstituted non-compressed data, the non-compressed data portion identified by the request.

7. The method of claim 1, wherein the compressed data file includes a plurality of independently-compressed blocks of compressed data, the plurality of blocks including two or more first blocks which include compressed data corresponding to the non-compressed data specified by the request and the plurality of blocks further including one or more second blocks which do not include compressed data corresponding to the non-compressed data specified by the request, and wherein:

the step of (c) using the index structure to identify, includes distinguishing the two or more first blocks from among the plurality of blocks;

the step of (e) decompressing includes decompressing the two or more first blocks but excludes decompressing the one or more second blocks; and the step of (f) providing includes providing one or more bytes from the decompressed first blocks.

8. The method of claim 7, wherein the compressed data file further includes a table of entries indicating locations at which the independently-compressed blocks begin in the compressed data file, and wherein the step of (c) using the index structure to identify, includes the steps of:

accessing the table of entries in the compressed data file and using said entries to identify an initial one of the first blocks and a final one of the first blocks.

9. The method of claim 1 wherein the compressed data file contains plural compressed data blocks packed such that each immediately precedes the next.

10. A machine implemented method of providing non-compressed data to a requestor from a compressed data file in response to a data request sent by the requestor, the data request identifying the desired non-compressed data in terms of where the desired non-compressed data resides within a non-compressed version of the data file, wherein the compressed data file is held in a storage means having a predefined storage structure and wherein the compressed data file is produced by a block-oriented compressor that restarts its compression process after having compressed a predefined block of bits of the non-compressed version of the data file, the method comprising the steps of:

(a) generating an index structure that identifies restart points within the compressed data file at which the block-oriented compressor restarted its compression process;

(b) using the index structure to identify, within the compressed data file, the location of a compressed data portion which corresponds to the non-compressed data identified by the data request when the identified compressed data portion comprises less than all data in the compressed data file;

(c) fetching the identified, compressed data portion from the storage means;

(d) decompressing the fetched, compressed data portion to reconstitute the corresponding non-compressed data;

(e) providing the reconstituted non-compressed data to the requestor in response to the data request;

(f) intercepting requests sent from the requestor to an operating system;

(g) in response to an intercepted request to open the compressed data file, creating a shadow file in the storage means, the shadow file acting at least as a placeholder for reserving storage area in the storage means at least as large as the decompressed size of the data represented by the compressed data file;

(h) in response to an intercepted request to read from the compressed data file:

(h.1) if the shadow file has not been written to, reading from the compressed data file in accordance with steps (b) through (e), and (h.2) if the shadow file has been filled with a decompressed copy of the data held in the compressed data file and the shadow file has been thereafter written to, reading the desired data directly from the shadow file;

(i) in response to an intercepted request to write new data to the compressed data file:

(i.1) if the shadow file has not been written to, decompressing the compressed data file, writing the decompressed data into the shadow file, writing the new data to the shadow file and deleting the compressed data file, and (i.2) if the shadow file has been written to, writing the new data to the shadow file; and (j) in response to an intercepted request to close the compressed data file:

(j.1) if the shadow file has not been written to, deleting the shadow file and closing the compressed data file, and (j.2) if the shadow file has been written to, closing the shadow file.

11. A machine-implemented method of providing non-compressed data to a requestor from a compressed data file in response to a data request sent by the requestor, the data request identifying the desired non-compressed data in terms of where the desired non-compressed data resides within a non-compressed version of the data file, wherein the compressed data file is held in a storage means having a predefined storage structure and wherein the compressed data file is produced by a block-oriented compressor that restarts its compression process after having compressed a predefined block of bits of the non-compressed version of the data file, the method comprising the steps of:

(a) generating an index structure that identifies restart points within the compressed data file at which the block-oriented compressor restarted its compression process;

(b) using the index structure to identify, within the compressed data file, the location of a compressed data portion which corresponds to the non-compressed data identified by the data request when the identified compressed data portion comprises less than all data in the compressed data file;

(c) fetching the identified, compressed data portion from the storage means;

(d) decompressing the fetched, compressed data portion to reconstitute the corresponding non-compressed data;.

(e) providing the reconstituted non-compressed data to the requestor in response to the data request;

(f) intercepting requests sent from the requestor to an operating system;

(g) in response to an intercepted request to open the compressed data file, creating a putback file, decompressing the compressed data file, writing the decompressed data into the putback file;

(h) in response to an intercepted request to read from the compressed data file, instead reading the requested data from the putback file;

(i) in response to an intercepted request to write to the compressed data file, instead writing to the putback file and, (i.1) if the putback file has not been previously written to, deleting the compressed data file; and (j) in response to an intercepted request to close the compressed data file, (j.1) if the putback file has not been written to, deleting the putback file, and (j.2) if the putback file has been written to, closing the putback file.

12. A machine-implemented method of reading desired data from a compressed data file in response to a supplied data request, wherein the compressed data file resides in a data storage means;

wherein the compressed data file includes blocks of independently compressed data each corresponding to respective non-compressed blocks of data in a corresponding non-compressed version of the data file, wherein the data request identifies the desired data in terms of where the corresponding non-compressed data resides in the non-compressed version of the data file, wherein the blocks of independently compressed data include two or more first blocks containing compressed data corresponding to the desired data and one or more second blocks not containing compressed data corresponding to the desired data, the method comprising the steps of:

(a) identifying, within the compressed data file, the two or more first blocks so as to distinguish the identified blocks from the one or more second blocks;

(b) fetching the identified two or more first blocks from the storage means;

(c) decompressing the fetched two or more first blocks while avoiding the step of decompressing the one or more second blocks; and (d) extracting the desired data from the decompressed two or more first blocks.

13. The method of claim 12, further comprising the steps of:

(e) caching the fetched and decompressed two or more first blocks of data; and in response to a second, subsequent data request seeking data contained in the cached data, skipping the fetching and decompressing steps (b and c) and instead extracting the desired data from the cached data.

14. The method of claim 12, wherein the method is performed by a computer system having a data processing unit operatively coupled to a relatively fast random access memory (RAM) and having a slower mass storage means serving as the storage means that holds the compressed data file, and wherein the fetching step (b) includes fetching the identified, two or more first blocks of compressed data from the mass storage means and storing the fetched first blocks of compressed data in the relatively faster random access memory (RAM);

wherein the decompressing step (c) includes using the data processing unit to decompress the two or more fetched first blocks of compressed data that are stored in RAM; and wherein the extracting step (d) includes using the data processing unit to extract from the decompressed RAM data, the non-compressed data portion identified by the request.

15. The method of claim 12, wherein the compressed data file further includes a table of entries indicating locations at which the blocks of independently compressed data each begin in the compressed data file, and wherein the step (a) of identifying includes the step of:

(a.1) accessing the table of entries to identify an initial one of the first blocks and a final one of the first blocks.

16. The method of claim 15, wherein the data request specifies a starting location and an ending location in the non-compressed version of the data file to indicate where the desired data resides, and wherein one or more entries in the table each identifies an offset from a predefined reference point of the compressed data file to the point where a corresponding block of compressed data begins, and wherein the identifying step (a) further comprises the steps of:

(a.2) finding a first entry identifying an offset corresponding to a location closest to but less than or equal to the starting location of the compressed version of the desired data;

(a.3) finding a second entry identifying an offset corresponding to a location closest to but greater than or equal to the ending location of the compressed version of the desired data; and (a.4) identifying all blocks corresponding to entries from the first entry to the second entry.

17. A machine implemented method of reading desired data from a compressed data file in response to a supplied data request, wherein the compressed data file resides in a data storage means;

wherein the compressed data file includes blocks of independently compressed data each corresponding to respective non-compressed blocks of data in a corresponding non-compressed version of the data file, wherein the data request identifies the desired data in terms of where the corresponding non-compressed data resides in the non-compressed version of the data file, wherein the blocks of independently compressed data include one or more first blocks containing compressed data corresponding to the desired data and one or more second blocks not containing compressed data corresponding to the desired data, the method comprising the steps of:

(a) identifying, within the compressed data file, the one or more first blocks so as to distinguish the identified blocks from the one or more second blocks;

(b) fetching the identified one or more first blocks from the storage means;

(c) decompressing the fetched one or more first blocks while avoiding the step of decompressing the one or more second blocks;

(d) extracting the desired data from the decompressed one or more first blocks;

wherein the compressed data file is maintained by an operating system installed in the method-implementing machine and wherein a requestor tries to access the compressed data file by sending an access request to the operating system, and said method further comprising the steps of:

(e) intercepting requests sent from the requestor to the operating system;

(f) creating a shadow file in the data storage means, the shadow file acting at least as a placeholder for reserving storage area in the data storage means at least as large as the decompressed size of the data represented by the compressed data file; and (g) if an intercepted request includes a request to write new, non-compressed data for a first time to the compressed data file, decompressing the data of the compressed data file, writing the decompressed data into the shadow file, discarding the compressed data file and renaming the shadow file with the name of the discarded, compressed data file.

18. A machine-implemented method of reading desired data from a compressed data file in response to a supplied data requests, wherein the compressed data file resides in a data storage means;

wherein the compressed data file includes blocks of independently compressed data each corresponding to respective non-compressed blocks of data in a corresponding non-compressed version of the data file, wherein the data request identifies the desired data in terms of where the corresponding non-compressed data resides in the non-compressed version of the data file, wherein the blocks of independently compressed data include one or more first blocks containing compressed data corresponding to the desired data and one or more second blocks not containing compressed data corresponding to the desired data, the method comprising the steps of:

(a) identifying, within the compressed data file, the one or more first blocks so as to distinguish the identified blocks from the one or more second blocks;

(b) fetching the identified one or more first blocks from the storage means;

(c) decompressing the fetched one or more first blocks while avoiding the step of decompressing the one or more second blocks;

(d) extracting the desired data from the decompressed one or more first blocks;

wherein the compressed data file is maintained by an operating system installed in the method-implementing machine and wherein a requestor tries to open and otherwise access the compressed data file by sending corresponding access requests to the operating system, said method further comprising the steps of:

(e) intercepting the access requests sent from the requestor to the operating system;

(f) upon the interception of a request to open the compressed data file, creating a shadow file in the data storage means, the shadow file acting at least as a placeholder for reserving storage area in the data storage means at least as large as the decompressed size of the data represented by the compressed data file; and (g) if a later intercepted request includes a request to close the compressed data file while no requests after the open tried to write new data to the compressed data file, discarding the shadow file and closing the compressed data file.

19. A machine-implemented method of reading desired data from a compressed data file in response to a supplied data request, wherein the compressed data file resides in a data storage means;

wherein the compressed data file includes blocks of independently compressed data each corresponding to respective non-compressed blocks of data in a corresponding non-compressed version of the data file, wherein the data request identifies the desired data in terms of where the corresponding non-compressed data resides in the non-compressed version of the data file, wherein the blocks of independently compressed data include one or more first blocks containing compressed data corresponding to the desired data and one or more second blocks not containing compressed data corresponding to the desired data, the method comprising the steps of:

(a) identifying, within the compressed data file, the one or more first blocks so as to distinguish the identified blocks from the one or more second blocks;

(b) fetching the identified one or more first blocks from the storage means;

(c) decompressing the fetched one or more first blocks while avoiding the step of decompressing the one or more second blocks;

(d) extracting the desired data from the decompressed one or more first blocks;

wherein the compressed data file is maintained by an operating system installed in the method-implementing machine, wherein a requestor tries to open and otherwise access the compressed data file by sending corresponding access requests to the operating system, and wherein circumstances indicate a likelihood that the requestor will try to write new data to the compressed data file, said method further comprising the steps of:

(e) intercepting the access requests sent from the requestor to the operating system;

(f) upon the interception of a request to open the compressed data file, creating a putback file in the data storage means;

(g) decompressing the data of the compressed data file and transferring the decompressed data into the putback file; and (h) if a later intercepted request includes a request to close the compressed data file while no requests after the open tried to write new data to the compressed data file, discarding the putback file and closing the compressed data file.

20. A machine-implemented method of reading desired data from a compressed data file in response to a supplied data request, wherein the compressed data file resides in a data storage means;

wherein the compressed data file includes blocks of independently compressed data each corresponding to respective non-compressed blocks of data in a corresponding non-compressed version of the data file, wherein the data request identifies the desired data in terms of where the corresponding non-compressed data resides in the non-compressed version of the data file, wherein the blocks of independently compressed data include one or more first blocks containing compressed data corresponding to the desired data and one or more second blocks not containing compressed data corresponding to the desired data, the method comprising the steps of:

(a) identifying, within the compressed data file, the one or more first blocks so as to distinguish the identified blocks from the one or more second blocks;

(b) fetching the identified one or more first blocks from the storage means;

(c) decompressing the fetched one or more first blocks while avoiding the step of decompressing the one or more second blocks;

(d) extracting the desired data from the decompressed one or more first blocks;

wherein the compressed data file is maintained by an operating system installed in the method-implementing machine, wherein a requestor tries to open and otherwise access the compressed data file by sending corresponding access requests to the operating system, and wherein circumstances indicate a likelihood that the requestor will try to write new data to the compressed data file, said method further comprising the steps of:

(e) intercepting the access requests sent from the requestor to the operating system;

(f) upon the interception of a request to open the compressed data file, creating a putback file in the data storage means;

(g) decompressing the data of the compressed data file and transferring the decompressed data into the putback file; and (h) if a later intercepted request includes a request to write new, non-compressed data to the compressed data file, writing the new data to the putback file and discarding the compressed data file.

21. A machine-implemented method of reading desired data from a compressed data file in response to a supplied data request, the compressed data file residing on a storage medium and including independently-compressed blocks of compressed data packed one adjacent to the next, the beginning and end locations of each compressed data block varying as a function of compression efficiency for the data held in the corresponding non-compressed version of the block and as a function of compression efficiency for the data held in the corresponding non-compressed versions of preceding blocks, if any, the data request specifying the desired data in terms of a starting location and an ending location of corresponding non-compressed data residing in a non-compressed version of the data file, wherein the desired data constitutes less than all the compressed data contained in the compressed data file and wherein the desired data is to be read from the storage medium into a random access memory (RAM), the method comprising the steps of:

(a) locating a first block of the independently-compressed blocks, which first block contains compressed data corresponding to non-compressed data at the starting location;

(b) after said locating step (a), decompressing the first block from the storage medium into RAM; and (c) if the first block does not contain compressed data corresponding to non-compressed data at the ending location, (c.1) further locating one or more additional blocks of the independently-compressed blocks up to a second block, the additional blocks containing compressed data corresponding to non-compressed data at locations up to the ending location, the second block including non-compressed data at the ending location, and (c.2) after said further locating step (c.1), decompressing the additional blocks from the storage medium into RAM.

22. The method of claim 21, further comprising the steps of:

(d) caching the decompressed blocks of data in RAM; and (e) in response to a second, subsequent data request that identifies data already contained in the cached data, skipping the decompressing steps corresponding to compressed blocks whose data is already in the cached data.

23. The method of claim 21, wherein the compressed data file further includes a table of entries indicating locations at which the independently-compressed blocks begin in the compressed data file, and wherein the locating steps (a and c.1) each include the step of:

accessing the table of entries to identify the corresponding first and additional blocks wherein the desired but compressed data is contained.

24. The method of claim 23, wherein the data request specifies a starting location and an ending location of the desired data within the non-compressed version of the data file, and wherein one or more entries in the table each identifies an offset from a predefined reference point of the compressed data file to a point in the compressed data file where a corresponding compressed block begins, and wherein the locating steps (a and c.1) include the steps of:

finding a first entry identifying an offset corresponding to a location address relatively close to but less than or equal to the starting location of the requested data;

finding a second entry identifying an offset corresponding to a location address relatively close to but greater than or equal to the ending location; and identifying all blocks corresponding to entries from the first entry to the second entry.

25. A machine-implemented method for supplying to a requestor of decompressed data, a decompressed segment of a compressed data file in response to a request from the requestor for only a portion of the data contained in the data file, wherein the compressed data file is held in a storage means having a predefined storage structure, wherein the data request identifies the desired non-compressed data in terms independent of the storage structure of the storage means, said independent identification of the desired non-compressed data being in terms of where the non-compressed data resides within a non-compressed version of the data file, and wherein the compressed data file is produced by a block-oriented compressor that restarts its compression process after having compressed a predefined block of bits of the non-compressed version of the data file, the method comprising the steps of:

identifying, within the compressed data file, the location of a compressed data block which contains data corresponding to the non-compressed data identified by the data request, the identified compressed data block comprising less than all data in the compressed data file but perhaps more than just the data requested by the requestor;

fetching the identified, compressed data block from the storage means;

decompressing the fetched, compressed data block to reconstitute a corresponding non-compressed data block;

identifying within the non-compressed data block, the portion requested by the requestor; and providing the identified portion of the reconstituted non-compressed data block to the requestor in response to the data request.

26. A machine-implemented method of providing non-compressed data to a requesting application program from a compressed data file in response to a data request sent by the application program to an operating system, the data request identifying the desired non-compressed data in terms of where the non-compressed data resides within a non-compressed version of the data file, wherein the compressed data file is produced by a block-oriented compressor that restarts its compression process after having compressed a predefined number of bits of the non-compressed version of the data file, the method comprising the steps of:

generating an index structure that identifies restart points within the compressed data file at which the block-oriented compressor restarted its compression process;

intercepting the data request before the request reaches the operating system;

using the index structure to identify, within the compressed data file, the location of a compressed data portion which corresponds to the non-compressed data identified by the intercepted data request, the identified compressed data portion comprising less than all data in the compressed data file;

fetching the identified, compressed data portion;

decompressing the compressed data portion to reconstitute the corresponding non-compressed data; and providing the reconstituted non-compressed data to the requesting application program in response to the data request.

27. An apparatus for extracting desired, non-compressed data from a potentially compressed data file, the potentially compressed data file being stored in a data storing means and organized when compressed as a packed series of compressed data blocks each having beginning and end locations that vary as a function of compression efficiency for the data held in the corresponding non-compressed version of the block and as a function of compression efficiency for the data held in the corresponding non-compressed versions of preceding blocks, if any, the apparatus receiving a data access request for data contained in the potentially compressed data file wherein the request identifies the desired data in terms of where the corresponding non-compressed data resides in a non-compressed version of the data file, the apparatus comprising:

compression checker means for determining whether the potentially compressed data file is actually compressed and includes a file format having independently-compressed data blocks representing predefined amounts of non-compressed data;

data structure means, responsive to the compression checker means, for constructing a data structure pointing to the independently-compressed data blocks of the compressed data file and indicating the amount of non-compressed data represented by each such block in the case where the compression checker means determines that the potentially compressed data file is actually compressed and has said format;

locator means, responsive to the data access request, for accessing the data structure to identify therefrom one or more of the independently-compressed blocks that include data requested by the data access request; and decompressor means, responsive to the locator means, for fetching from the data storing means the compressed data contained in the identified one or more blocks and for decompressing the fetched data.

28. The apparatus of claim 27, further comprising:

file shadowing means for creating a shadow file in the data storing means, the shadow file acting at least as a placeholder for reserving storage area in the data storing means at least as large as the decompressed size of the data represented by the compressed data file.

29. The apparatus of claim 27, further comprising:

file putback means for creating a putback file in the data storing means, for decompressing the data of the compressed data file and transferring the decompressed data into the putback file; and if a later received access request includes a request to close the compressed data file while no requests after a first received access request tried to write new data to the compressed data file, for at that time discarding the putback file and closing the compressed data file.

30. A compressed data accessing device for providing access to a non-compressed version of target data held in a subportion of a compressed data file, the compressed data file being composed of a series of compressed data blocks each having beginning and end locations that vary as a function of compression efficiency for the data held in the corresponding non-compressed version of the block and as a function of compression efficiency for the data held in the corresponding non-compressed versions of preceding blocks, if any, said accessing device comprising:

request receiving means for receiving access requests that each identify the target data in terms of where the non-compressed version of the target data resides within a non-compressed version of the compressed data file;

subportion identifying means, responsive to access requests received by the request receiving means, for identifying a first subportion of the compressed data file containing compressed data corresponding to the identified target data and distinguishing the first subportion from a second subportion not containing data corresponding to the identified target data;

fetching means, responsive to the subportion identifying means, for fetching the first subportion of the compressed data file after the first subportion is identified by said subportion identifying means; and decompressing means, operatively coupled to the fetching means, for decompressing the fetched first subportion of the compressed data file.

31. The data access device of claim 30, wherein the compressed data blocks of said compressed data file are independently-compressed blocks, the blocks including two or more first blocks containing the compressed target data and further including one or more second blocks not containing the compressed target data, and wherein the subportion identifying means further comprises:

means for determining which of the plurality of blocks are the first blocks.

32. The data access device of claim 31, wherein:

the means for decompressing decompresses only the first blocks to thereby reconstitute a decompressed version of the target data, wherein the decompressed data can include data other than the target data; and the means for decompressing further includes separating means for separating the decompressed target data from other portions of the decompressed data.

33. The data access device of claim 32, further comprising:

means for caching the decompressed data in random access memory; and means, responsive to a subsequent request for second target data already contained in the cached data, for providing the second target data directly from the cached data rather than from the compressed data file.

\* \* \* \* \*

UNITED STATES PATENT AND TRADEMARK OFFICE
CERTIFICATE OF CORRECTION

PATENT NO. : 5,481,701
DATED : January 2, 1996
INVENTOR(S) : Lloyd L. Chambers, IV It is certified that error appears in the above-indentified patent and that said Letters Patent is hereby corrected as shown below:

Column 11, line 22, "'*prey'" should be --"*prev"--.
Column 38, line 15, "claim 3" should be --claim 4--.

Signed and Sealed this

Fourteenth Day of May, 1996

Attest:

BRUCE LEHMAN

Attesting Officer   Commissioner of Patents and Trademarks